(12) United States Patent
Lee et al.

(10) Patent No.: US 11,974,492 B2
(45) Date of Patent: Apr. 30, 2024

(54) DISPLAY DEVICE

(71) Applicant: Samsung Display Co., LTD., Yongin-si (KR)

(72) Inventors: Kyoung Ah Lee, Seoul (KR); Min Gu Kim, Seoul (KR); Ji Soo Kim, Hwaseong-si (KR); Hyo Yul Yoon, Seoul (KR); Eui Yun Jang, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 224 days.

(21) Appl. No.: 17/123,900

(22) Filed: Dec. 16, 2020

(65) Prior Publication Data

US 2021/0265578 A1 Aug. 26, 2021

(30) Foreign Application Priority Data

Feb. 20, 2020 (KR) .......................... 10-2020-0021248

(51) Int. Cl.
*H01L 51/00* (2006.01)
*B32B 7/12* (2006.01)
*B32B 17/10* (2006.01)
*H10K 50/84* (2023.01)
*H10K 59/12* (2023.01)
*H10K 71/00* (2023.01)
(Continued)

(52) U.S. Cl.
CPC .............. *H10K 77/111* (2023.02); *B32B 7/12* (2013.01); *B32B 17/10* (2013.01); *H10K 50/841* (2023.02); *H10K 59/12* (2023.02); *H10K 71/00* (2023.02); *B32B 2307/51* (2013.01); *B32B 2457/20* (2013.01); *H10K 2102/311* (2023.02)

(58) Field of Classification Search
None
See application file for complete search history.

(56) References Cited

U.S. PATENT DOCUMENTS

2016/0240817 A1* 8/2016 Cho ..................... H01L 51/5256
2019/0148670 A1* 5/2019 Wang ................. H10K 50/8445
257/790
(Continued)

FOREIGN PATENT DOCUMENTS

KR 10-2017-0072973 6/2017
KR 10-2019-0053691 5/2019
(Continued)

*Primary Examiner* — Anthony J Frost
(74) *Attorney, Agent, or Firm* — KILE PARK REED & HOUTTEMAN PLLC

(57) ABSTRACT

A display device includes a first region, a second region adjacent to a side of the first region, and a third region adjacent to another side of the first region; a display panel in the first region, the second region and the third region; a window on and overlapping the display panel; and a bonding member between the display panel and the window and in the first region, the second region and the third region. The bonding member includes a first bonding part having a first elastic modulus and in the first region, a second bonding part having a second elastic modulus and in the second region, and a third bonding part having a third elastic modulus and in the third region. The first elastic modulus is greater than each of the second elastic modulus and the third elastic modulus.

22 Claims, 21 Drawing Sheets

(51) Int. Cl.
   *H10K 77/10*    (2023.01)
   *H10K 102/00*   (2023.01)

(56) References Cited

U.S. PATENT DOCUMENTS

2019/0173030 A1\* 6/2019 Kim .................. B32B 7/12
2019/0259310 A1\* 8/2019 Ha ................... G09F 9/301

FOREIGN PATENT DOCUMENTS

KR    10-2020-0103217       9/2020
KR        20200103217 A  *  9/2020   ............... G02F 1/15

\* cited by examiner

450: 451, 453, 455
410: 411, 413, 415

450_4: 451_3, 453_4

DISPLAY DEVICE

CROSS REFERENCE TO RELATED APPLICATION(S)

This application claims priority to and benefits of Korean Patent Application No. 10-2020-0021248 under 35 U.S.C. § 119 filed on Feb. 20, 2020 in the Korean Intellectual Property Office, the entire contents of which are incorporated herein by reference.

BACKGROUND

1. Technical Field

The disclosure relates to a display device, and, to a display device that may switch between a folded state and an unfolded state.

2. Description of the Related Art

Display devices display images. More and more display devices have a larger display screen than existing display devices, without increasing the volume or thickness. Flexible display devices such as a foldable display device or a bendable display device are being developed, which have a structure that may be folded and unfolded to provide a large screen in a case that they are used.

A flexible display device may have a composite stack structure including elements stacked on one another. For example, the flexible display device may include a display panel such as an organic light-emitting display panel or a liquid-crystal crystal display panel, a window disposed on the front face of the display panel, and a support film disposed on the rear face of the display panel. The flexible display device may include optically clear bonding members that may connect or couple the elements with one another.

In a case that the elements are folded, the curvature portion or region or the folding region of the flexible display device may be bent or folded, and may be unfolded again in a case that the elements are unfolded.

As the elements are folded and unfolded repeatedly, the flatness of each member may differ depending on the physical properties of the optically clear bonding member.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a display device in which elements stacked on one another may have uniform flatness in a case that the display device is folded and unfolded repeatedly.

It should be noted that objects of the disclosure are not limited to the above-mentioned objects. Other objects of the disclosure will be apparent to those skilled in the art from the following descriptions.

An embodiment provides a display device may include a first region, a second region adjacent to a side of the first region, and a third region adjacent to another side of the first region; a display panel disposed in the first region, the second region and the third region; a window disposed on and overlapping the display panel; and a bonding member disposed between the display panel and the window and disposed in the first region, the second region and the third region. The bonding member may comprise a first bonding part having a first elastic modulus and disposed in the first region, a second bonding part having a second elastic modulus and disposed in the second region, and a third bonding part having a third elastic modulus and disposed in the third region. The first elastic modulus may be greater than each of the second elastic modulus and the third elastic modulus.

The first elastic modulus may have a value that is equal to or greater than ten times the second elastic modulus and the third elastic modulus.

The first elastic modulus may range from about 50 kpa to about 500 kpa.

The first bonding part may include a first side surface aligned with a boundary between the first region and the second region, and a second side surface aligned with a boundary between the first region and the third region.

The second bonding part may comprise a first inner side surface on a side of the second bonding part, the first inner side surface contacting the first side surface of the first bonding part; and a first outer side surface on another side of the second bonding part, the third bonding part may comprise a second inner side surface on a side of the third bonding part, the second inner side surface contacting the second side surface of the first bonding part; and a second outer side surface on another side of the third bonding part. The second elastic modulus of the second bonding part may decrease from the first inner side surface to the first outer side surface.

The second elastic modulus of the second bonding part may decrease stepwise from the first inner side surface to the first outer side surface.

The second elastic modulus of the second bonding part may decrease linearly from the first inner side surface to the first outer side surface.

The second elastic modulus of the second bonding part may decrease non-linearly from the first inner side surface to the first outer side surface.

The second elastic modulus of the second bonding part may be inversely proportional to a square of a distance from the first inner side surface and may decrease non-linearly from the first inner side surface to the first outer side surface.

The first bonding part may have a first thickness, and the second bonding part may have a second thickness, the second thickness of the second bonding part may increase from the first inner side surface to the first outer side surface, the first thickness may be uniform, and an average thickness of the second thickness may be greater than the first thickness.

The second thickness of the second bonding part may increase linearly from the first inner side surface to the first outer side surface.

The second thickness of the second bonding part may increase non-linearly from the first inner side surface to the first outer side surface.

The third bonding part may have a third thickness, the third thickness may increase from the second inner side surface to the second outer side surface, and an average thickness of the third thickness may be greater than the first thickness of the first bonding part.

The third bonding part may comprise a second inner side surface on a side of the third bonding part, the second inner side surface contacting the second side surface of the first-panel window bonding part; and a second outer side surface on another side of the third bonding part. The third elastic modulus of the third bonding part may decrease from the second inner side surface to the second outer side surface.

The display device may further comprise a fourth bonding part disposed between the first bonding part and the second bonding part; and a fifth bonding part disposed between the first bonding part and the third bonding part, wherein the fourth bonding part may have a fourth elastic modulus between the first elastic modulus and the second elastic modulus, and the fifth bonding part may have a fifth elastic modulus between the first elastic modulus and the third elastic modulus.

The display device may further comprise a support film disposed apart from the window with the display panel disposed between the support film and the window; and a panel-support film bonding member disposed between the support film and the display panel. The panel-support film coupling layer member may comprise a first panel-support film bonding part disposed in the first region, a second panel-support film bonding part disposed in the second region, and a third panel-support film bonding part disposed in the third region. An elastic modulus of the first panel-support film bonding part may be greater than an elastic modulus of the second panel-support film bonding part and an elastic modulus of the third panel-support film bonding part.

An embodiment provides a display device that may have a folding region, a first non-folding region adjacent to a side of the folding region, and a second non-folding region adjacent to another side of the folding region; a display panel disposed in the folding region, the first non-folding region and the second non-folding region; a window disposed on and overlapping the display panel; and a bonding member disposed between the display panel and the window and disposed in the folding region, the first non-folding region and the second non-folding region. The window may comprise a first surface facing the display panel and a second surface opposite to the first surface, wherein the second surface of the window disposed in the first non-folding region may face the second surface of window disposed in the second non-folding region in a folded state, the bonding member may comprise a first bonding part having a first elastic modulus and disposed in the folding region, a second bonding part having a second elastic modulus and disposed in the first non-folding region, and a third bonding part having a third elastic modulus and disposed in the second non-folding region. The first elastic modulus may be greater than each of the second elastic modulus and the third elastic modulus.

The first elastic modulus may have a value that is equal to or greater than ten times the second elastic modulus and the third elastic modulus.

The first elastic modulus may range from about 50 kpa to about 500 kpa.

The display device may further comprise a support film disposed apart from the window with the display panel disposed between the support film and the window; and a panel-support film bonding member disposed between the support film and the display panel. The panel-support film bonding member may comprise a first panel-support film bonding part disposed in the folding region, a second panel-support film bonding part disposed in the first non-folding region, and a third panel-support film bonding part disposed in the second non-folding region. An elastic modulus of the first panel-support film bonding part may be greater than an elastic modulus of the second panel-support film bonding part and an elastic modulus of the third panel-support film bonding part.

According to an embodiment of the disclosure, elements stacked on one another in a display device may have uniform flatness in a cast that the display device may be folded and unfolded repeatedly.

It should be noted that effects of the disclosure are not limited to those described above and other effects of the disclosure will be apparent to those skilled in the art from the following descriptions.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
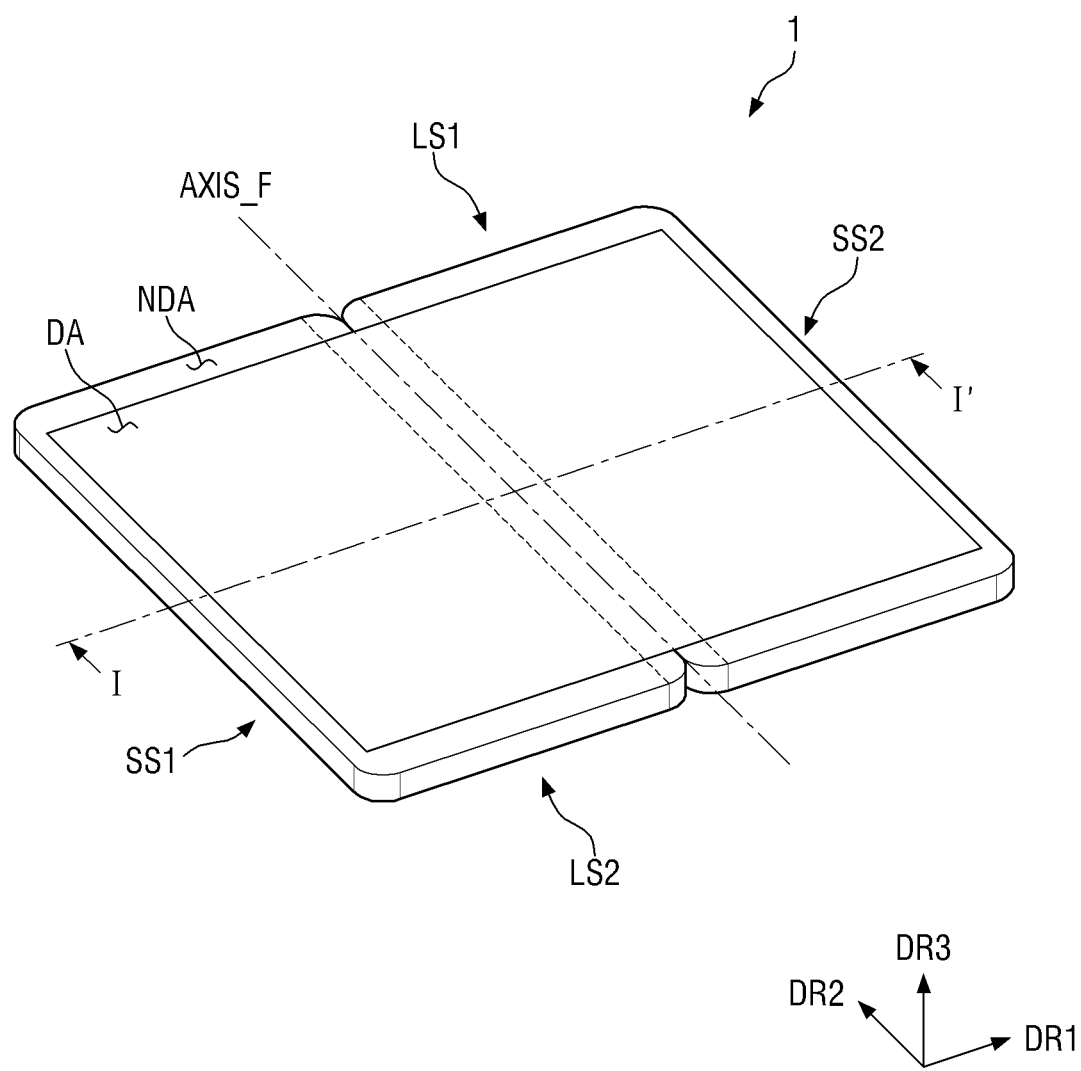
FIG. 1 is a perspective view of a display device according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description.

Some of the parts which are not associated with the description may not be provided in order to describe embodiments of the disclosure and like reference numerals refer to like elements throughout the specification.

As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof. The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that although the terms "first," "second," etc. may be used herein to describe various components, these components should not be limited by these terms. These components are only used to distinguish one component from another. For example, a first element referred to as a first element in one embodiment may be referred to as a second element in another embodiment without departing from the scope of the appended claims. As used herein, the singular forms "a," "an" and "the" are intended to include the plural forms as well, unless the context clearly indicates otherwise. It will be further understood that the terms "comprises" and/or "comprising" "includes" and/or "including", "have" and/or "having" are used in this specification, they or it may specify the presence of stated features, integers, steps, operations, elements and/ or components, but do not preclude the presence or addition of other features, integers, steps, operations, elements, components, and/or any combination thereof.

When a layer, film, region, substrate, or area, or element is referred to as being "on" another layer, film, region, substrate, or area, or element, it may be directly on the other film, region, substrate, or area, or element, or intervening films, regions, substrates, or areas, or elements may be present therebetween. Conversely, when a layer, film, region, substrate, or area, or element, is referred to as being "directly on" another layer, film, region, substrate, or area, or element, intervening layers, films, regions, substrates, or areas, may be absent therebetween. Further when a layer, film, region, substrate, or area, or element, is referred to as being "below" another layer, film, region, substrate, or area, or element, it may be directly below the other layer, film, region, substrate, or area, or element, or intervening layers, films, regions, substrates, or areas, or elements, may be present therebetween. Conversely, when a layer, film, region, substrate, or area, or element, is referred to as being "directly below" another layer, film, region, substrate, or area, or element, intervening layers, films, regions, substrates, or areas, or elements may be absent therebetween. Further, "over" or "on" may include positioning on or below an object and does not necessarily imply a direction based upon gravity. The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Sizes of components in the drawings may be exaggerated for convenience of explanation. In other words, since sizes and thicknesses of components in the drawings are arbitrarily illustrated for convenience of explanation, the following embodiments are not limited thereto.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

In the specification, an expression such as "A and/or B" indicates A, B, or A and B. Also, an expression such as "at least one of A and B" indicates A, B, or A and B.

In embodiments below, when a component is referred to as being "on a plane," it is understood that a component is viewed from the top, and when a component is referred to as being "on a schematic cross section," it is understood that the component is vertically cut and viewed from the side.

It will be understood that when a layer, region, or component is referred to as being "connected" or "coupled" to another layer, region, or component, it may be "directly connected" or "directly coupled" to the other layer, region, or component and/or may be "indirectly connected" or "indirectly coupled" to the other layer, region, or component with other layers, regions, or components interposed therebetween. For example, it will be understood that when a layer, region, or component is referred to as being "electrically connected" or "electrically coupled" to another layer, region, or component, it may be "directly electrically connected" or "directly electrically coupled" to the other layer, region, or component and may be "indirectly electrically connected" or "indirectly electrically coupled" to the other layer, region, or component with other layers, regions, or components interposed therebetween.

Also, when an element is referred to as being "in contact" or "contacted" or the like to another element, the element may be in "electrical contact" or in "physical contact" with another element; or in "indirect contact" or in "direct contact" with another element.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that may not be perpendicular to one another.

Unless otherwise defined, all terms (including technical and scientific terms) used herein have the same meaning as commonly understood by one of ordinary skill in the art to which embodiments pertain. In addition, it will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, the embodiments of the disclosure will be described in detail with reference to the attached drawings, and like reference numerals in the drawings denote like reference elements.

FIG. 1 is a perspective view of a display device according to an embodiment.

Referring to FIG. 1, a display device 1 may be a foldable display device. As used herein, the term foldable may refer to a flexible state, and by way of non-limiting example, may encompass bendable, and/or rollable. The term foldable should be interpreted as encompassing partially foldable, fully foldable, inwardly foldable, and outwardly foldable.

The display device 1 may include a folding axis AXIS_F extended in a vertical direction of the display device in a case that the display device is viewed from the top. The display device 1 may be folded over the folding axis AXIS_F.

The display device 1 may have a substantially rectangular shape in a case that the display device is viewed from the top. The display device 1 may be either a rectangle having corners at right angles or a rectangle having rounded corners in a case that the display device is viewed from the top. The display device may include four edges LS1, LS2, SS1 and SS2. The display device may include longer-side edges LS1 and LS2 and shorter-side edges SS1 and SS2. For example, the longer-side edges LS1 and LS2 may be extended in the first direction DR1, while the shorter-side edges SS1 and SS2 may be extended in the second direction DR2.

As shown in FIG. 1, the folding axis AXIS_F may be extended in the direction traversing the longer sides LS1 and LS2, for example, the second direction DR2. In such case, the longer-side edges LS1 and LS2 of the display device 1 may be folded. Different from that shown in the drawings, the folding axis AXIS_F may be extended in the direction traversing the shorter sides SS1 and SS2, in which case the shorter-side edges SS1 and SS2 of the display device 1 may be folded. In the following description, the folding axis AXIS_F may be extended in the direction traversing the longer-side edges LS1 and LS2 for convenience of illustration. The folding axis AXIS_F may cross the central portion or region of each of the longer-side edges LS1 and LS2, but the disclosure is not limited thereto.

As used herein, "above" and "upper surface" in the thickness direction refer to the display side, whereas "below" and "lower surface" refer to the opposite side, unless specifically stated otherwise. In addition, "upper side," "lower side," "left side," and "right side" in a plan view are defined in a case that the display surface is viewed from the top.

The display device 1 may include a display area DA and a non-display area NDA around, surrounding, or adjacent to the display area DA. Images may be displayed in the display area DA. Images may not be displayed in the non-display area NDA. The display area DA may be located or disposed in the center portion or region of the display device 1. In a case that the display device 1 is folded, the display area DA may be separated into two parts with respect to the folding axis AXIS_F, which may overlap each other. In a case that the display device 1 is unfolded, the parts of the display area DA may be unfolded, where images may be displayed. Although not shown in the drawings, the non-display area NDA may include a pad area electrically connected to a printed circuit board. Pads may be disposed in the pad area to be electrically connected to lead lines of the printed circuit board.

Grooves (for example, notches) recessed toward an upper side and a lower side in a case that the grooves are viewed from the top may be formed at the intersections between the folding axis AXIS_F and each of the first longer side LS1 and the second longer side LS2 of the display device 1. A hinge member that may switch between the folded and unfolded states may be connected or coupled at each of the grooves, for example.

As will be described below with reference to FIG. 3, a folding region FR and non-folding regions NFR1 and NFR2 may be defined on the display device 1 with respect to the folding axis AXIS_F (see FIG. 3).

For example, the display device 1 may include the folding region FR located or disposed at the center portion or region and including the folding axis AXIS_F, and the non-folding regions NFR1 and NFR2 spaced apart from each other with the folding region FR therebetween. The first non-folding region NFR1 may be located or disposed on a side of the folding region FR in the first direction DR1, while the second non-folding region NFR2 may be located or disposed on another side of the folding region FR in the first direction DR1.

The folding region FR may be the portion or region of the display device 1 that may be folded or bent with a predetermined curvature in a folding direction in a case that the display device 1 is folded. The non-folding regions NFR1 and NFR2 may be the portions or regions that are not folded in a case that the display device 1 is folded, different from the folding region FR. The non-folding regions NFR1 and NFR2 may be located or disposed on the same flat plane, but the disclosure is not limited thereto. The non-folding regions NFR1 and NFR2 may include partially bent portions.

Hereinafter, folding of the display device 1 according to an embodiment will be described in detail.

Figure 2:
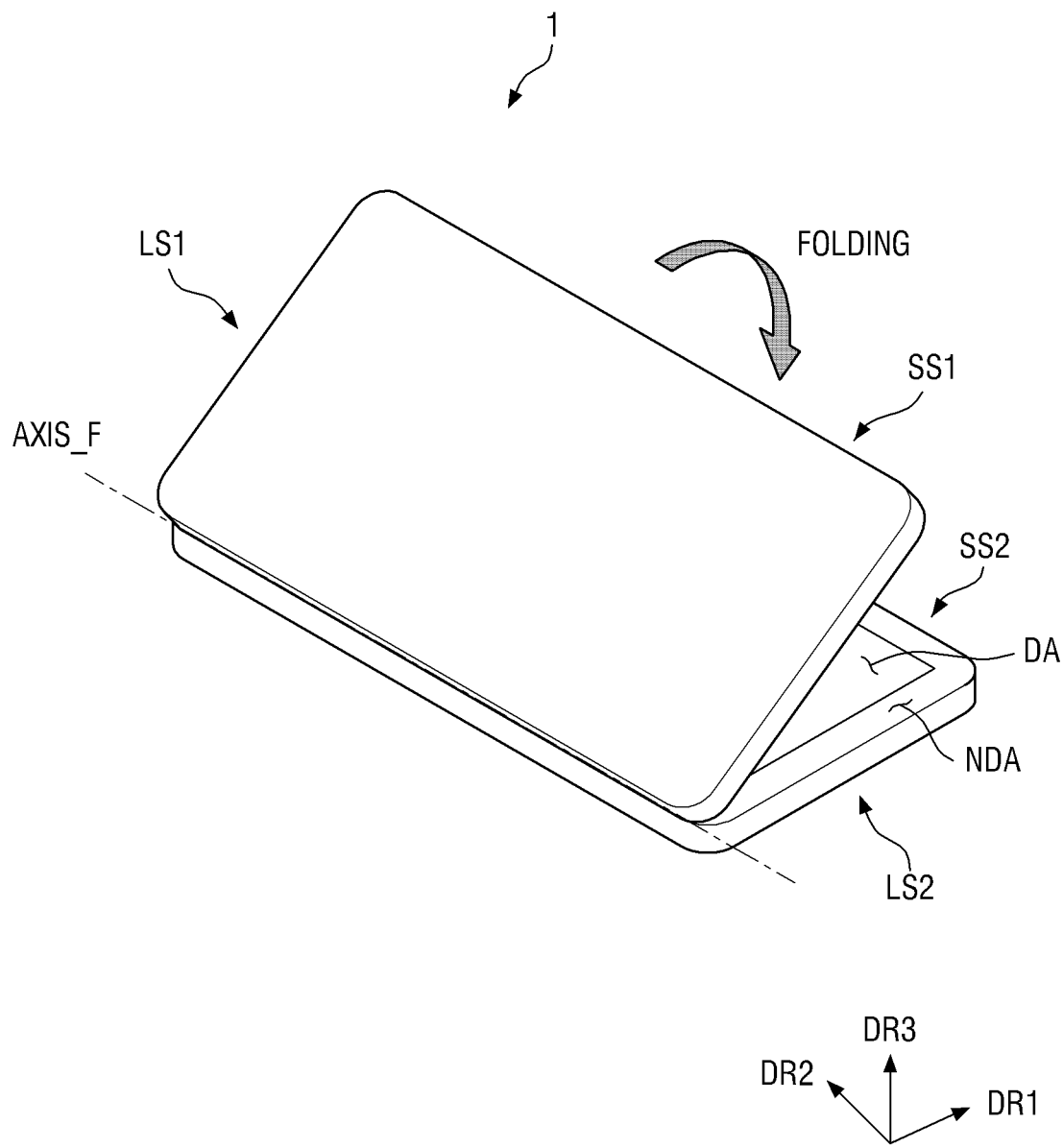
FIG. 2 is a perspective view of a folded display device according to an embodiment.

FIG. 2 is a perspective view of a display device according to an embodiment in a case that the display device is folded.

Referring to FIG. 2, in a case that an external force is applied from the left side along the folding direction (the upper direction or the third direction DR3 of FIG. 2), the display device 1 may be folded, such that the folding region FR of the display device 1 may be bent or folded while the first non-folding region NFR1 of the display device 1 may be moved or rotated along the folding direction to overlap the second non-folding region NFR2 or face the second non-folding region NFR2. For example, the display device 1 may include a first surface and a second surface opposite to the first surface. In a case that the display device 1 according to an embodiment is a top-emission display device, the first surface of the display device 1 may be the display surface of the display device 1 while the second surface may be the opposite surface to the display surface.

In a case that the display device 1 is folded, the folding region FR of the display device 1 may be bent so that the first surfaces of the non-folding regions NFR1 and NFR2 of the display device 1 may face each other.

In the example shown in FIG. 2, the display device 1 is an in-folding display device, for example, the display surfaces of the display device 1 may face each other whereas the opposite surfaces face the opposite sides.

In an embodiment, the display device 1 may be an out-folding display device. In the following description, an in-folding display device is employed as the display device 1.

Figure 3:
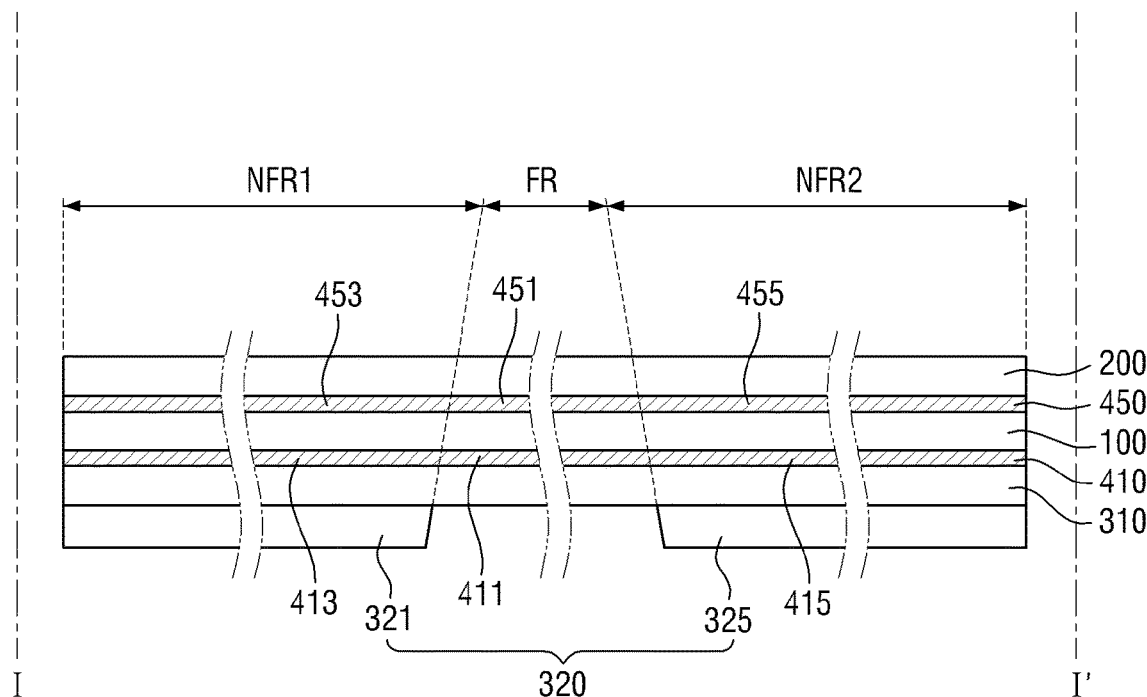
FIG. 3 is a schematic cross-sectional view taken along line I-I' of FIG. 1.
Figure 3:
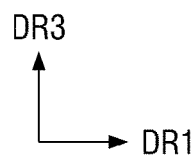
Figure 4:
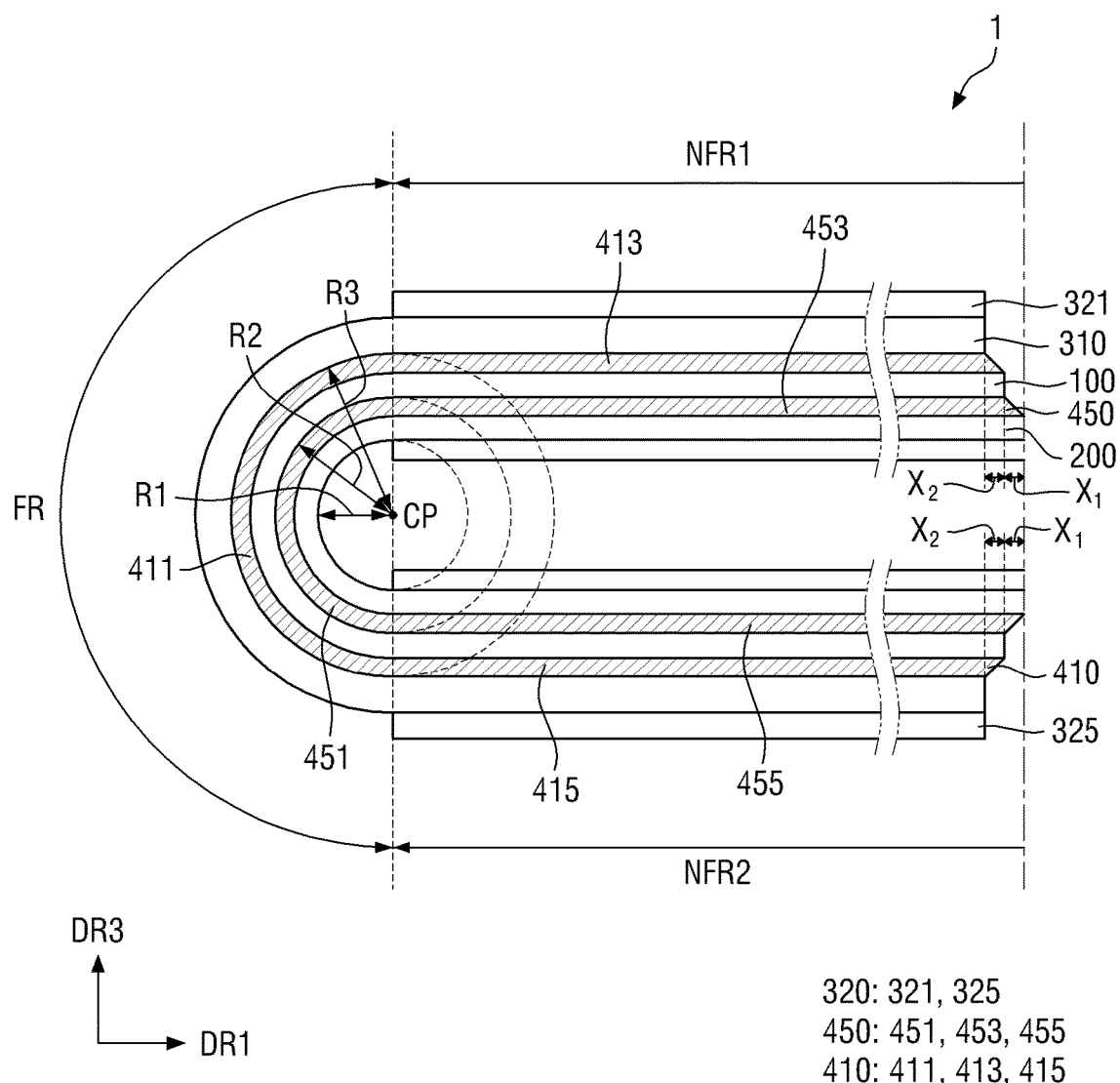
FIG. 4 is a schematic cross-sectional view of a folded display device according to an embodiment.
Figure 5:
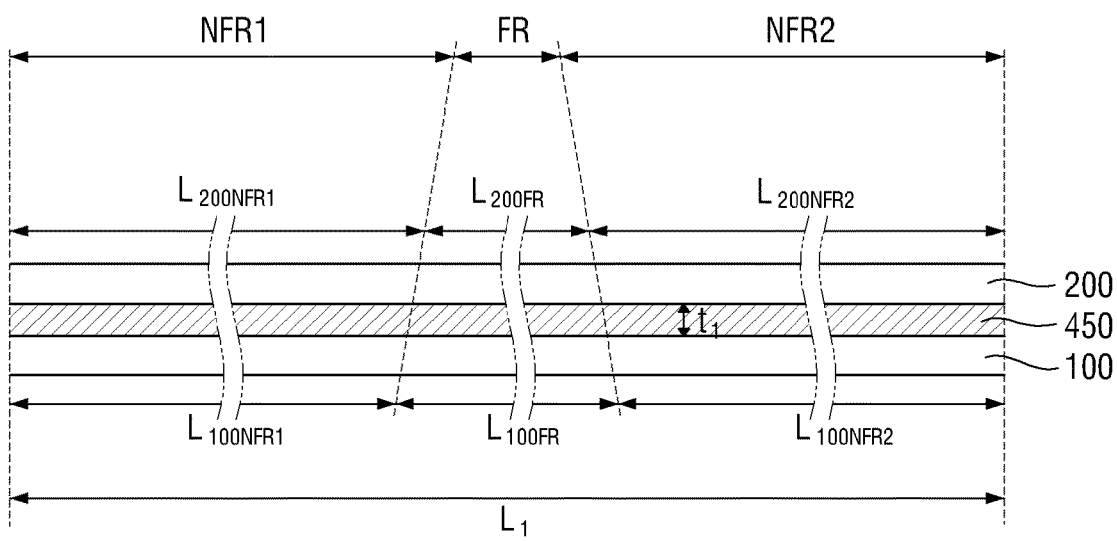
FIG. 5 is an enlarged, schematic cross-sectional view of a part of the display device shown in FIG. 3.
Figure 6:
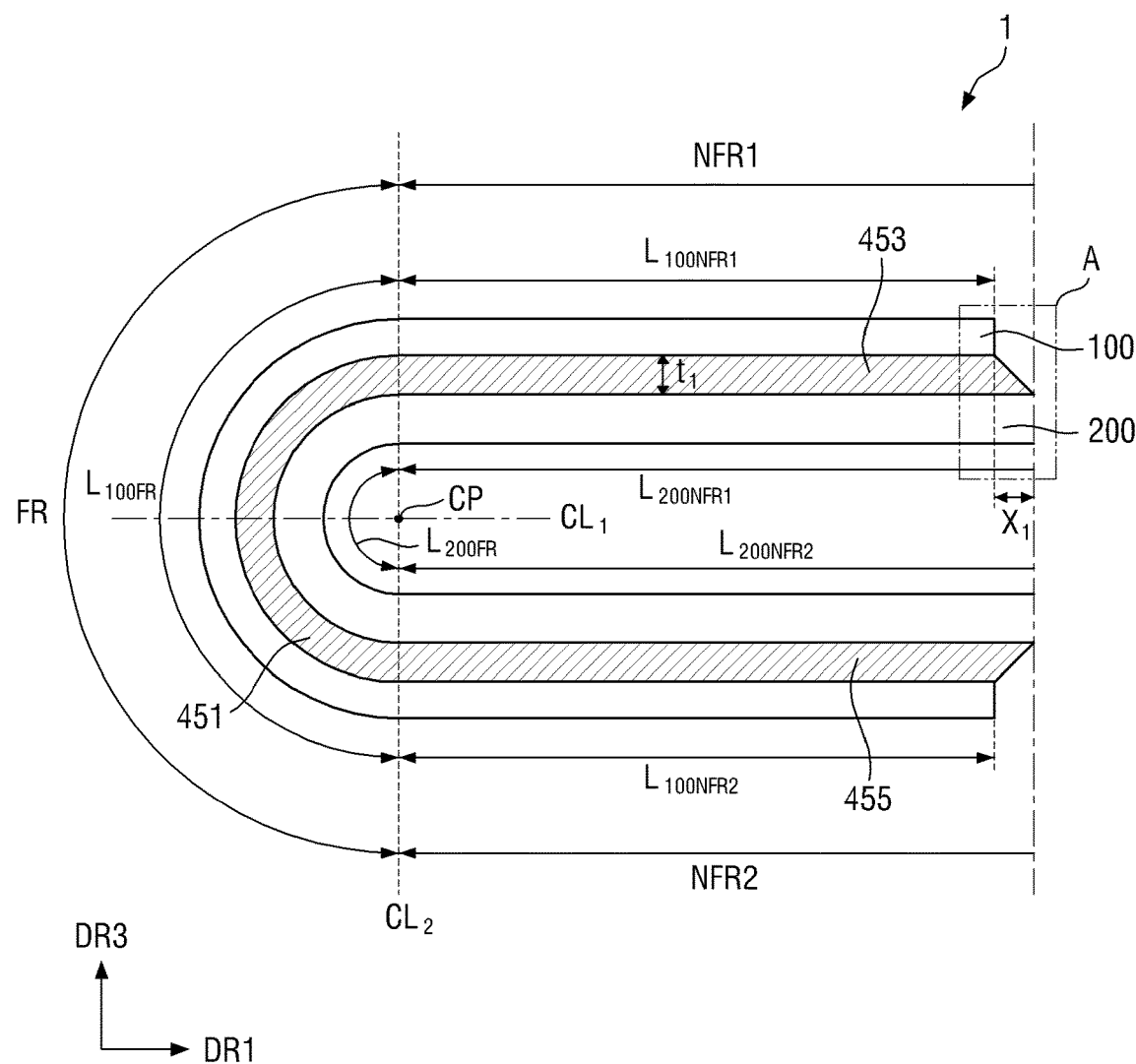
FIG. 6 is an enlarged, schematic cross-sectional view of a part of the display device shown in FIG. 4.
Figure 7:
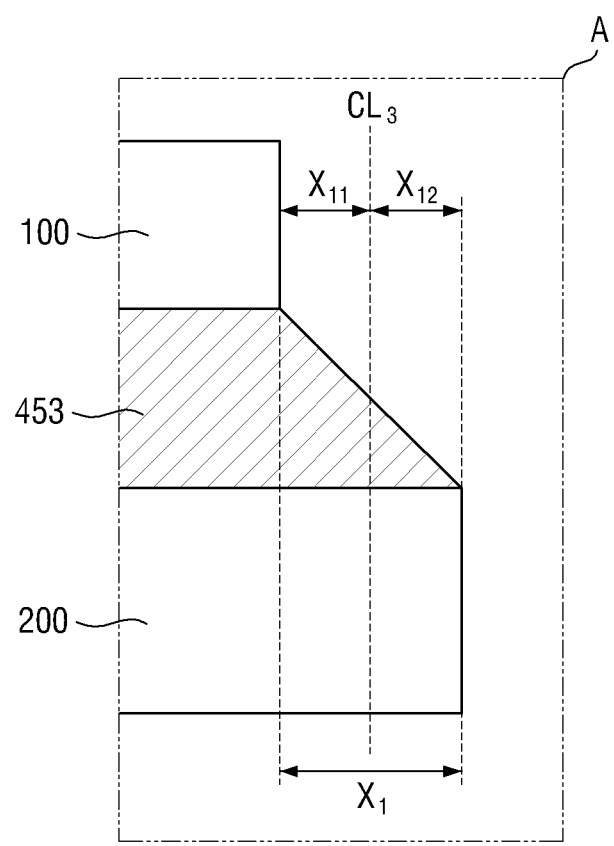
FIG. 7 is an enlarged schematic cross-sectional view of area A of FIG. 6.
Figure 8:
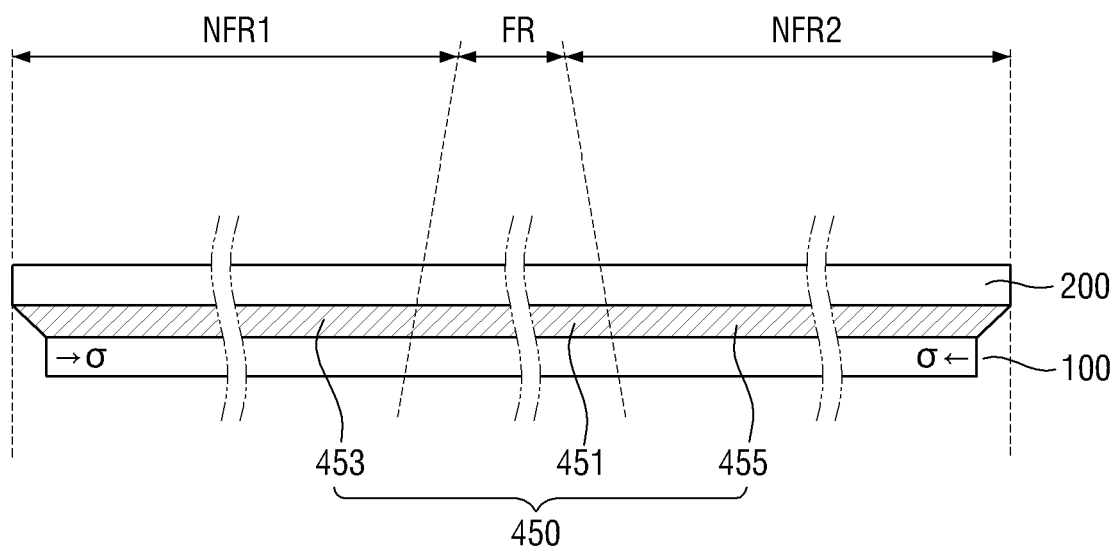
FIG. 8 is a schematic cross-sectional view of the display panel and the window of FIG. 6 in an unfolded state.

FIG. 3 is a schematic cross-sectional view taken along line I-I' of FIG. 1. FIG. 4 is a schematic cross-sectional view of a display device according to an embodiment in a case that the display device is folded. FIG. 5 is an enlarged, schematic cross-sectional view of a part of the display device shown in FIG. 3. FIG. 6 is an enlarged, schematic cross-sectional view of a part of the display device shown in FIG. 4. FIG. 7 is an enlarged schematic cross-sectional view of area A of FIG. 6. FIG. 8 is a schematic cross-sectional view of the display panel and the window of FIG. 6 in a case that they are unfolded again.

Referring to FIGS. 1 and 3 to 8, a display device 1 according to an embodiment may include a display panel 100, a window 200, a support film 310, and support members 320 (321 and 325). The display device 1 according to an embodiment may include a bonding member 450 that may connect or couple the display panel 100 with the window 200, and a panel-support film bonding member 410 that may connect or couple the display panel 100 with the support film 310.

The display panel 100 may be disposed across the folding region FR and the non-folding regions NFR1 and NFR2. An organic light-emitting display panel, a liquid-crystal display panel, a plasma display panel, an electrophoretic display panel, an electrowetting display panel, a quantum-dot emission display panel, a micro LED display panel, a nano LED display panel, for example, may be employed as the display panel 100. In the illustrated embodiment, an organic light-emitting display panel is employed as the display panel 100.

The display panel 100 may include a flexible substrate including a flexible polymer material such as polyimide (PI). Accordingly, the display panel 100 may be curved, bent, folded, or rolled. The display panel 100 may have a shape generally similar to that of the display device 1 in a case that the display panel 100 may be viewed from the top. Pixels may be disposed in the area of the display panel 100 overlapping the display area DA, and signal lines or driving circuits that may apply a signal to each pixel may be disposed in the area of the display panel 100 overlapping the non-display area NDA.

Each of the pixels may include an emissive layer and a circuit layer that may control the amount of light emitted from the emissive layer. The circuit layer may include lines, electrodes and at least one transistor. According to an embodiment, the emissive layer may include an organic light-emitting material. The emissive layer may be sealed by an encapsulation layer. The encapsulation layer may seal the emissive layer to prevent moisture and the like from being introduced from the outside. The encapsulation layer may be made up of a single inorganic layer or multiple layers thereof, or a stack of inorganic layers and organic layers alternately stacked on one another.

The window 200 may be disposed on the display panel 100. The window 200 may overlap the display panel 100 in the thickness direction. The window 200 may be disposed across the folding region FR and the non-folding regions NFR1 and NFR2. The size of the window 200 may be substantially equal to the size of the display panel 100 in a case that the display panel 100 may be viewed from the top.

The window 200 may serve to cover or overlap and protect the elements 100, 310, 320, 410 and 450 disposed thereunder or below. The window 200 may be made of glass, quartz, or the like within the spirit and the scope of the disclosure. The thickness of the window 200 may be less than about 100 In an embodiment, the window 200 may include ultra thin glass (UTG), which is chemically tempered.

The support film 310 may be disposed under or below the display panel 100. The support film 310 may overlap the display panel 100 in the thickness direction. The support film 310 may be disposed across the folding region FR and the non-folding regions NFR1 and NFR2. The size of the support film 310 may be substantially equal to the size of the display panel 100 in a case that the display panel 100 may be viewed from the top.

The support film 310 may serve to support the display panel 100 thereon. The support film 310 may include an organic insulating material. Examples of the organic insulating material may include polyacrylate resin, epoxy resin, phenolic resin, polyamide resin, polyimide resin, unsaturated polyesters resin, polyphenylene ether resin, polyphenylene sulfide resin, or benzocyclobutene (BCB), for example.

The support members 321 and 325 may be disposed under or below the support film 310. The first support member 321 may be disposed in the first non-folding region NFR1, and the second support member 325 may be disposed in the second non-folding region NFR2. The first support member 321 and the second support member 325 may be spaced apart from each other with a predetermined distance on the folding region FR. In an embodiment, the support members 321 and 325 may be extended to and disposed in the folding region FR. Even in this case, the support members 321 and 325 may be spaced apart from each other with a predetermined spacing in the folding region FR.

The support members 321 and 325 may include a metal or an alloy of at least two metals. Examples of the metals included in the support members 321 and 325 include, but is not limited to, aluminum (Al), copper (Cu), iron (Fe), chromium (Cr), and the like within the spirit and the scope of the disclosure. In an embodiment, the support members 321 and 325 may include stainless steel (SUS), which is an alloy of iron (Fe) and chromium (Cr). In an embodiment, the support members 321 and 325 may include aluminum (Al).

The bonding member 450 may connect or couple the display panel 100 with the window 200, and the panel-support film bonding member 410 may connect or couple the display panel 100 with the support film 310.

Each of the bonding member 450 and the panel-support film bonding member 410 may be a light-transmitting bonding member. For example, each of the bonding member 450 and the panel-support film bonding member 410 may include an optically clear adhesive (OCA) or an optically clear resin (OCR). For a top-emission display device, the bonding member 450 may be located disposed on the side where light exits from the display panel 100 to the outside. Accordingly, the transmittance of the bonding member 450 may be higher than that of the panel-support film bonding member 410 located or disposed on or under or below the display panel 100. It is, however, to be understood that the disclosure is not limited thereto. The transmittance of the bonding member 450 may be equal to that of the panel-support film bonding member 410. The bonding members 410 and 450 may have a uniform thickness. For example, the bonding member 450 may have a first thickness t1. The panel-support film bonding member 410 may have, but is not limited to, a thickness equal to the first thickness t1.

In the foregoing description, the folding region FR and the non-folding regions NFR1 and NFR2 may be defined on the display device 1. It is, however, to be noted that the folding region FR and non-folding regions NFR1 and NFR2 may be defined on each of the elements 100, 200 and 310 of the display device 1. The folding region FR and the non-folding regions NFR1 and NFR2 may be divided from one another according to the radii of curvature of the elements 100, 200 and 310 of the display device 1 in the folding region FR. As shown in FIG. 4, the elements 100, 200 and 310 of the display device 1 may be bent with different radii of curvature R1, R2, and R3, respectively. Each of the radii of curvature R1, R2, and R3 may have a constant value. For example, the elements 100, 200 and 310 of the display device 1 may have different radii of curvature R1, R2 and R3, respectively, with respect to the center point CP, and may have a substantially arc shape that may be a part of a circle. The arc shape portion of each of the elements 100, 200 and 310 with different radii of curvature R1, R2 and R3 with respect to the center point CP may be defined as the folding region FR of each of the elements 100, 200 and 310.

The first radius of curvature R1 may be smaller than the second radius of curvature R2, and the second radius of curvature R2 may be smaller than the third radius of curvature R3. In other words, the first radius of curvature R1 may be the smallest, the second radius of curvature R2 may have a value between the third radius of curvature R3 and the first radius of curvature R1, and the third radius of curvature R3 may be the largest.

A surface of the window 200 adjacent to the center point CP in the folding region FR of the window 200 may have a substantially semicircular shape with the constant first radius of curvature R1 from the center point CP. In a case that the surface of the window 200 adjacent to the center point CP in the folding region FR has the semicircular shape with the constant first radius of curvature R1 from the center point CP, the length of the folding region FR of the window 200 may be equal to $\pi*R1$. A surface of the display panel 100 adjacent to the center point CP in the folding region FR may have a substantially semicircular shape with the constant second radius of curvature R2 from the center point CP. In a case that the surface of the display panel 100 adjacent to the center point CP in the folding region FR has the semicircular shape with the constant second radius of curvature R2 from the center point CP, the length of the folding region FR of the display panel 100 may be equal to $\pi*R2$. A surface of the support film 310 adjacent to the center point CP in the folding region FR may have a substantially semicircular shape with the constant third radius of curvature R3 from the center point CP. In a case that the surface of the support film 310 adjacent to the center point CP in the folding region FR has the semicircular shape with the constant third radius of curvature R3 from the center point CP, the length of the folding region FR of the support film 310 may be equal to $\pi*R3$. As the first radius of curvature R1 may be smaller than the second radius of curvature R2, and the second radius of curvature R2 may be smaller than the third radius of curvature R3, the length of the folding region FR of the window 200 may be smaller than that of the display panel 100, and the length of the folding region FR of the display panel 100 may be smaller than that of the support film 310.

In the example shown in FIG. 4, the boundary between the folding region FR and the non-folding regions NFR1 and NFR2 of the each of the elements 100, 200 and 310 may be aligned with one another in the thickness direction (third direction DR3) in a case that the display device 1 is folded.

In an embodiment, the folding regions FR defined in the elements 100, 200 and 310 may have the lengths of the above-described $\pi*R1$, $\pi*R2$ and $\pi*R3$, respectively, within margins of error. For example, the length of the folding region FR defined on the window 200 may be $\pi*R1$ (in a range of about 4 mm to about 5 mm), the length of the folding region FR defined on the display panel 100 may be $\pi*R2$ (in a range of about 4 mm to about 5 mm), and the length of the folding region FR defined on the support film 310 may be $\pi*R3$ (in a range of about 4 mm to about 5 mm).

As shown in FIG. 3, the side surfaces of the elements 100, 200 310 may be substantially aligned with one another in the thickness direction (third direction DR3). For example, the elements 100, 200 and 310 may have substantially the same length so that the side surfaces may be aligned with one another in the thickness direction in a case that the display device 1 is unfolded. On the other hand, the lengths of the folding regions FR defined on the elements 100, 200 and 310 may be sequentially increased in the order of the window 200, the display panel 100 and the support film 310 as described above. Therefore, the lengths of the non-folding regions NFR1 and NFR2 of the elements 100, 200 and 310 may be sequentially reduced in the order of the window 200, the display panel 100 and the support film 310.

In an embodiment, the folding regions FR defined on the elements 100, 200 and 310, respectively, may all have substantially the same length. If the lengths of the folding regions FR of the elements 100, 200 and 310 are all equal, the lengths of the non-folding regions NFR1 and NFR2 of the elements 100, 200 and 310 may also be all equal. In such case, the lengths of the folding regions FR of the elements 100, 200 and 310 may be equal to the length of the folding region FR of the support film 310 located or disposed on the outer circumferential surface among the elements 100, 200 and 310 shown in FIG. 3 or may be equal to the length of the folding region FR of the support film 310 located or disposed on the inner circumferential surface among the elements 100, 200 and 310 shown in FIG. 3. In the following description, the folding regions FR of the elements 100, 200 and 310 may have different lengths.

The elements 100, 200 and 310 of the display device 1 may keep substantially the same length whether the display device 1 is folded or unfolded.

Accordingly, in a case that the display device 1 is folded, the boundary lines between the folding regions FR and the adjacent non-folding regions NFR1 and NFR2 of the elements 100, 200 and 310 may be aligned with one another in the thickness direction (third direction DR3) as shown in FIG. 4. On the other hand, the opposite ends of the non-folding regions NFR1 and NFR2 of the elements 100, 200 and 310 of the display device 1 may be rolled inward in the opposite direction to the direction indicated by the arrow of the first direction DR1 so that the ends of the support film 310 may be located or disposed more to the inside than the ends of the display panel 100 and the ends of the display panel 100 may be located or disposed more to the inside than the ends of the window 200.

In the following description, a first length difference $X_1$ may be defined as the length between the ends of the non-folding regions NFR1 and NFR2 of the window 200 and the ends of the non-folding regions NFR1 and NFR2 of the display panel 100. A second length difference $X_2$ may be defined as the length between the ends of the non-folding regions NFR1 and NFR2 of the display panel 100 and the ends of the non-folding regions NFR1 and NFR2 of the support film 310.

In order to make the difference between the ends of the non-folding regions NFR1 and NFR2 of the display panel 100 and the ends of the non-folding regions NFR1 and NFR2 of the window 200 equal to the first length difference $X_1$, the length of the entire non-folding regions NFR1 and NFR2 of the window 200 should be changed from the boundary by a portion of the first length difference $X_1$ toward the folding region FR, while the length of the entire non-folding regions NFR1 and NFR2 of the display panel 100 should be change by the rest of the portion of the first length difference $X_1$ in the opposite direction, for example, toward the ends of the non-folding regions NFR1 and NFR2.

Similarly, in order to make the difference between the ends of the non-folding regions NFR1 and NFR2 of the display panel 100 and the ends of the non-folding regions NFR1 and NFR2 of the support film 310 equal to the second length difference $X_2$, the length of the entire non-folding regions NFR1 and NFR2 of the display panel 100 should be changed from the boundary by a portion of the second length difference $X_2$ toward the folding region FR, while the length of the entire non-folding regions NFR1 and NFR2 of the support film 310 should be change by the rest of the portion of the second length difference $X_2$ in the opposite direction, for example, toward the ends of the non-folding regions NFR1 and NFR2.

The entire non-folding regions NFR1 and NFR2 of each of the elements 100, 200 and 310 should move smoothly relative to each other. Therefore, the bonding member 450 and the panel-support film bonding member 410 that may connect or couple the elements 100, 200 and 310 should have substantially no resistance. In practice, however, the bonding member 450 and the panel-support film bonding member 410 that may connect or couple the elements 100, 200 and 310 may have a certain resistance as they may have a high elastic modulus. Due to the resistances of the bonding member 450 and the panel-support film bonding member 410, the above-described relative movement of the elements 100, 200 and 310 may be hindered. As a result, physical deformation may occur in the non-folding regions NFR1 and NFR2. In view of the above, it is desired that the bonding member 450 and the panel-support film bonding member 410 have a low resistance, for example, a low elastic modulus in the non-folding regions NFR1 and NFR2.

In a case that the folded display device 1 is to be unfolded, it takes time for the bonding member 450 and the panel-support film bonding member 410 to recover, for example, until the side surfaces of the elements 100, 200 and 310 are aligned with one another or have substantially the same length. Accordingly, the length of one of the elements becomes shorter than the length of another one of the elements disposed thereon, and thus compressive stress toward the folding region FR may be generated. The compressive stress may result in wrinkles on the element disposed under or below the other element in the folding region FR. It may be possible to avoid such wrinkles if the bonding member 450 and the panel-support film bonding member 410 that may connect or couple the elements 100, 200 and 310 have a high elastic modulus. In view of the above, it is desired that the bonding member 450 and the panel-support film bonding member 410 have a high resistance, for example, a high elastic modulus in the folding region FR.

In order to prevent physical deformation of each of the elements 100, 200 and 310 in the non-folding regions NFR1 and NFR2 and to prevent wrinkles on the element disposed on another element in the folding region FR, it is desired that the bonding members 450 and 410 may have different elastic moduli in the folding region FR and the non-folding regions NFR1 and NFR2. Accordingly, as shown in FIGS. 3 and 4, the bonding member 450 may have a first bonding part 451 having a high elastic modulus in the folding region FR, and may have bonding parts 453 and 455 having a low elastic modulus in the non-folding regions NFR1 and NFR2. Similarly, the panel-support film bonding member 410 may have a first panel-support film bonding part 411 having a high elastic modulus in the folding region FR, and may have panel-support film bonding parts 413 and 415 having a low elastic modulus in the non-folding regions NFR1 and NFR2.

In FIG. 6, a line that passes through the center point CP and equally divides the folding region FR may be defined as a first reference line $CL_1$, and a line that passes through the center point CP and the boundary between the folding region FR and the non-folding regions NFR1 and NFR2 may be defined as a second reference line $CL_2$.

As shown in FIGS. 5 and 6, the display panel 100 may have a first panel length $L_{100FR}$ in the folding region FR, and second panel lengths $L_{100NFR1}$ and $L_{100NFR2}$ in the non-folding regions NFR1 and NFR2, respectively. The window 200 may have a first window length $L_{200FR}$ in the folding region FR, and second window lengths $L_{200NFR1}$ and $L_{200NFR2}$ in the non-folding regions NFR1 and NFR2, respectively. The first panel length $L_{100FR}$ may be larger than the first window length $L_{200FR}$, and the second panel lengths $L_{100NFR1}$ and $L_{100NFR2}$ may be smaller than the second window lengths $L_{200NFR1}$ and $L_{200NFR2}$, respectively. A length Li may represent the total lengths of the non-folding regions NFR1 and NFR2 and the folding region FR.

As shown in FIG. 7, in order to make the difference between the ends of the non-folding regions NFR1 and NFR2 of the display panel 100 and the ends of the non-folding regions NFR1 and NFR2 of the window 200 equal to the first length difference $X_1$, the length of the entire non-folding regions NFR1 and NFR2 of the window 200 should be changed from the boundary by a portion $X_{11}$ of the first length difference $X_1$ toward the folding region FR, while the length of the entire non-folding regions NFR1 and NFR2 of the display panel 100 should be changed by the rest of the portion $X_{12}$ of the first length difference $X_1$ in the opposite direction, for example, toward the ends of the non-folding regions NFR1 and NFR2. Accordingly, the ends of the display panel 100 may be located or disposed more to the inside than the ends of the window 200 by the first length difference $X_1$. As illustrated in FIG. 7, a third reference line $CL_3$ may divide portions $X_{11}$ and $X_{12}$.

The entire non-folding regions NFR1 and NFR2 of each of the elements 100, 200 and 310 should move smoothly relative to each other. Therefore, the bonding member 450 should have substantially no resistance. In practice, however, the bonding member 450 that may connect or couple the elements 100 and 200 may have a predetermined resistance as it may have a high elastic modulus. If the bonding member 450 has a resistance, the relative movement between the elements 100 and 200 may be hindered as expressed in Equation 1 below:

$$x = \frac{t}{GL^2} \qquad \text{[Equation 1]}$$

where x denotes the relative movement amount between elements 100 and 200, t denotes the thickness of the bonding member 450, G denotes the modulus (or elastic modulus) of the bonding member 450, and L denotes the distance from the second reference line $CL_2$.

It may be seen from Equation 1 that the relative movement amount between the elements 100 and 200 decreases in inverse proportion to the square of L away from the second reference line $CL_2$. As an example, the relative movement amount between the elements 100 and 200 may be rapidly decreased depending on the distance L from the second reference line $CL_2$. In a case that this happens, the stress may be greatly increased because the length change cannot be accepted as the relative movement is decreased. As a result, buckling may occur in the thickness direction or physical deformation such as a crack or cracking may occur.

Referring to FIG. 8, In a case that the folded display device 1 is to be unfolded, it may take time for the bonding member 450 to recover, for example, until the side surfaces of the elements 100 and 200 may be aligned with one another or have substantially the same length. Accordingly, the length of the lower element 100 may become shorter than the length of the upper element 200, and thus compressive stress σ toward the folding region FR may be generated. The compressive stress σ may result in wrinkles on the lower element having a smaller length in the folding region FR. It may be possible to avoid such wrinkles if the bonding member 450 that may connect or couple the elements 100 and 200 have a high elastic modulus.

Such relationship may be expressed by Equation 2 below:

$$\sigma cr = \sqrt{\left(\frac{tf}{3ta} \times Ef \times Ea\right)}. \qquad \text{[Equation 2]}$$

where $\sigma_{cr}$ denotes the stress that results in wrinkles, tf denotes the thickness of the element, to denotes the thickness of the bonding member, Ef denotes the stiffness or elasticity modulus of the film, and Ea denotes the stiffness or elasticity modulus of the bonding member.

In order to prevent physical deformation of each of the elements 100 and 200 in the non-folding regions NFR1 and NFR2 and to prevent wrinkles on the element disposed on another element in the folding region FR, it is desired that the bonding member 450 may have different elastic moduli in the folding region FR and the non-folding regions NFR1 and NFR2. Accordingly, the bonding member 450 may include the first bonding part 451 that may have a high elastic modulus in the folding region FR, and the panel-support film bonding parts 453 and 455 that may have a low elastic modulus in the non-folding regions NFR1 and NFR2.

The first bonding part 451 may overlap the folding region FR, and the side surfaces thereof may be aligned with the boundaries between the folding region FR and the non-folding regions NFR1 and NFR2, respectively. Each of the second bonding parts 453 and 455 may overlap the respective non-folding regions NFR1 and the NFR2, and the side surfaces thereof may be aligned with the boundaries between the folding region FR and the non-folding regions NFR1 and NFR2 and the ends of the non-folding regions NFR1 and NFR2, respectively.

The first bonding part 451 may have a first elastic modulus E1 that may be a high elastic modulus, and the second bonding parts 453 and 455 may have a second elastic modulus E2 that may be a low elastic modulus. The first elastic modulus E1 may be greater than the second elastic modulus E2.

For example, the first elastic modulus E1 may be equal to or greater than 10 times or 20 times the second elastic modulus E2. In an embodiment, the first elastic modulus E1 may range from about 50 kpa to about 500 kpa, and the second elastic modulus E2 may range from about 5 kpa to about 10 kpa. In an embodiment, the first elastic modulus E1 may range from about 50 kpa to about 500 kpa, and the second elastic modulus E2 may range from about 2.5 kpa to about 5 kpa. In an embodiment, the first elastic modulus E1 may range from about 500 kpa to about 1,000 kpa, and the second elastic modulus E2 may range from about 50 kpa to about 100 kpa.

The above descriptions on the bonding member 450 and the adjacent elements 100 and 200 with reference to FIGS. 6 to 8 may be equally applied to the panel-support film bonding member 410 and the adjacent elements 100 and 310.

Hereinafter, a method of producing the above-described bonding members 410 and 450 will be described.

Although the bonding member 450 is shown in FIGS. 9 to 12, the description may be equally applied to the panel-support film bonding member 410.

Figure 9:
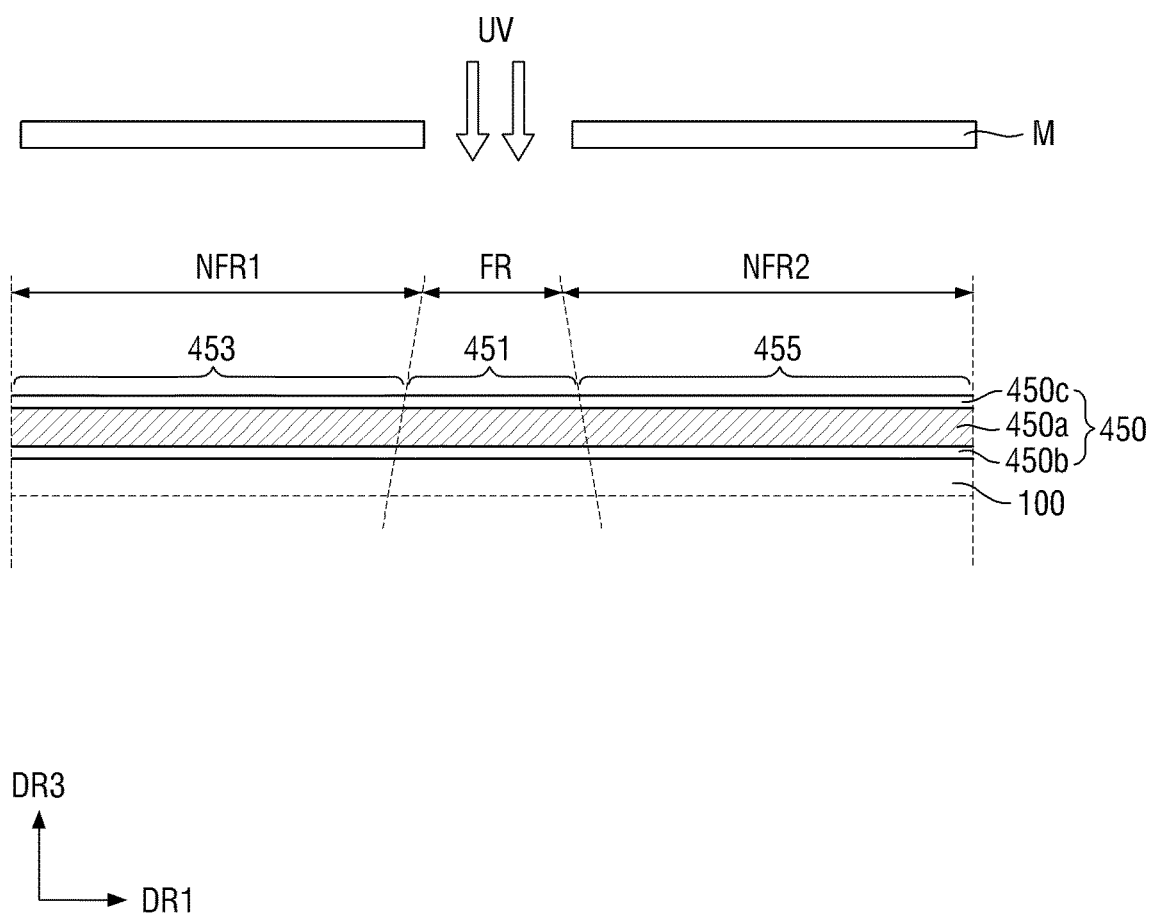
FIG. 9 is a schematic cross-sectional view showing a process of producing a bonding member according to an embodiment.
Figure 10:
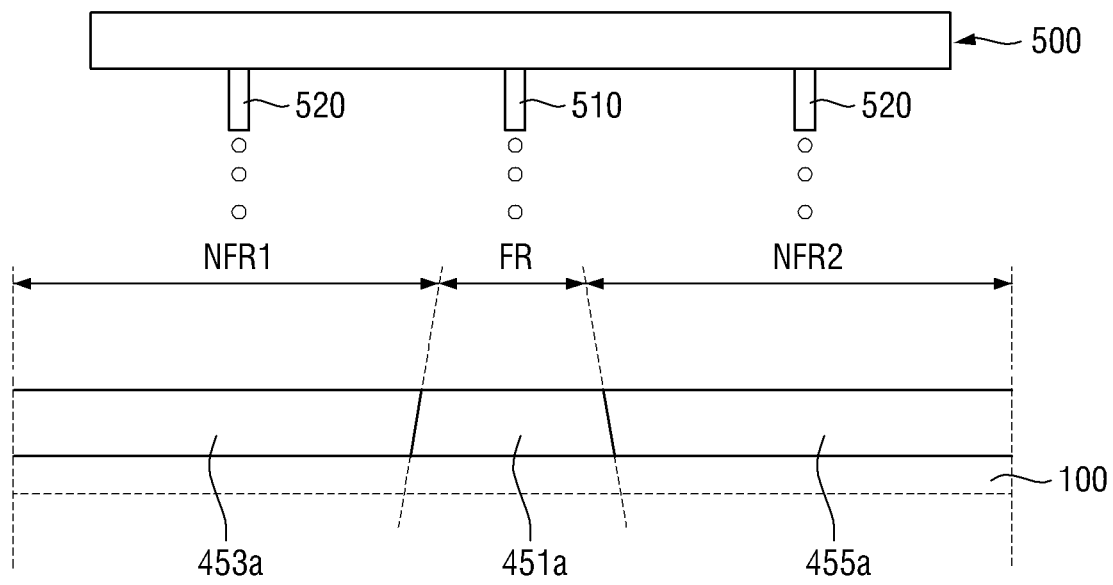
FIGS. 10 to 12 are schematic cross-sectional views illustrating processing steps for producing a bonding member according to an embodiment.
Figure 10:
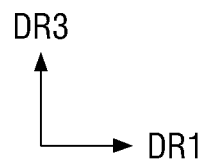
Figure 11:
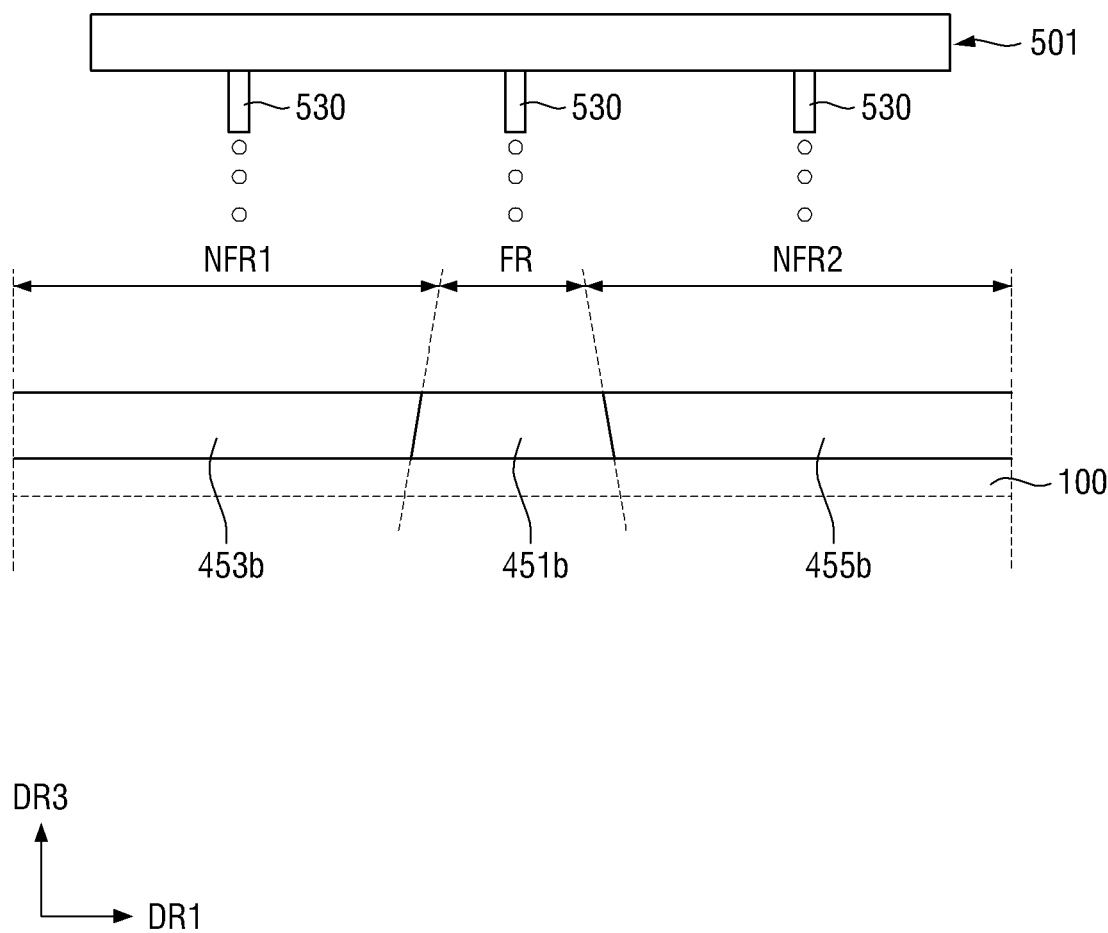
Figure 12:
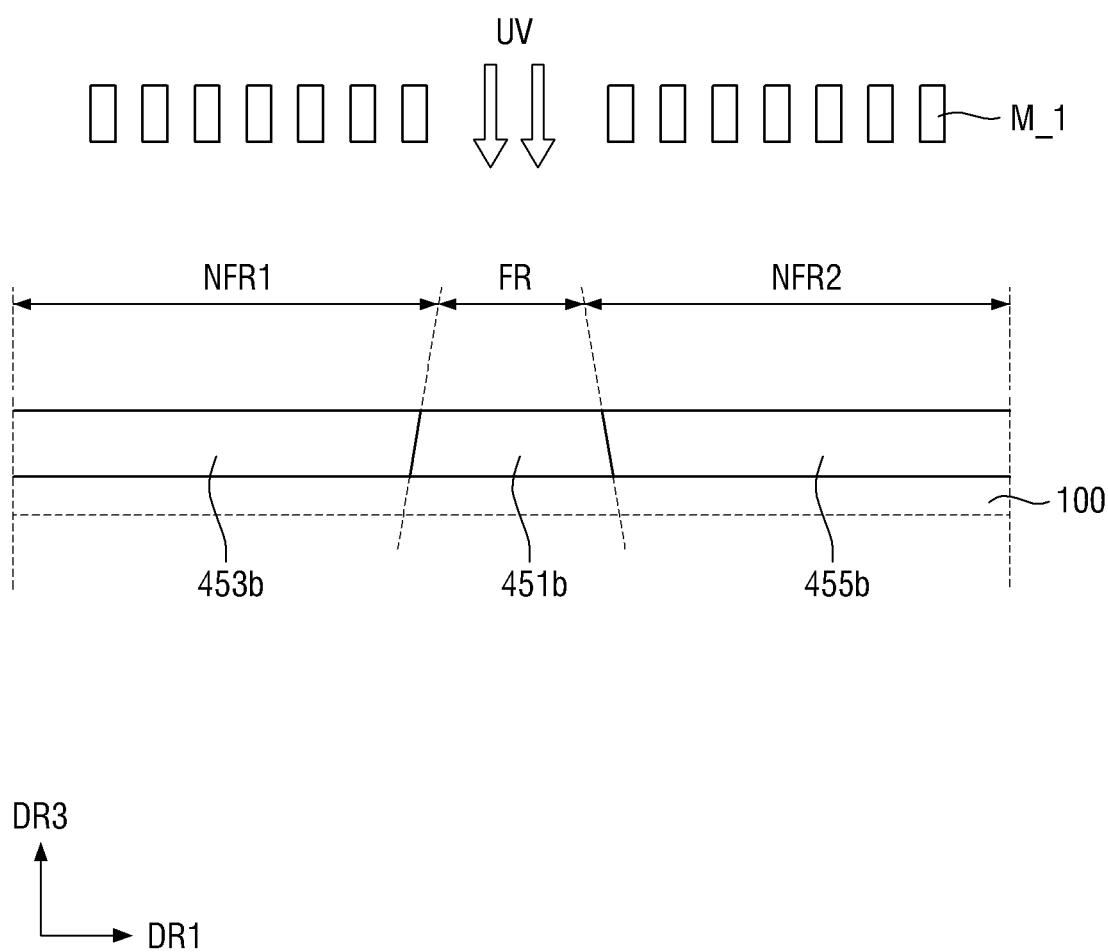

FIG. 9 is a schematic cross-sectional view showing a process of producing a bonding member according to an embodiment. FIGS. 10 to 12 are schematic cross-sectional views illustrating processing steps for producing a bonding member according to an embodiment. FIG. 9 shows an example where the bonding member 450 may include an optically clear adhesive (OCA). FIGS. 10 to 12 show an example where the bonding member 450 may include an optically clear resin (OCR).

Referring initially to FIG. 9, the bonding member 450 may include a substrate 450a, a first bonding layer 450b disposed on a lower surface of the substrate 450a, and a second bonding layer 450c disposed on an upper surface of the substrate 450a.

The first bonding layer 450b may be disposed and attached on the display panel 100.

The bonding member 450 including the substrate 450a, the first bonding layer 450b disposed on the lower surface of the substrate 450a, and the second bonding layer 450c disposed on the upper surface of the substrate 450a may be disposed on the display panel 100, and may be irradiated with ultraviolet (UV) light through a mask M. The mask M may mask the non-folding regions NFR1 and NFR2 while exposing the folding region FR. The folding region FR exposed via the mask M may be irradiated with ultraviolet (UV) light. Accordingly, the first bonding part 451 disposed in the folding region FR may have a higher elastic modulus than the second bonding parts 453 and 455 respectively disposed on a side and another side of the folding region FR.

Subsequently, referring to an embodiment shown in FIG. 10, a nozzle apparatus 500 may be placed above the display panel 100. The nozzle apparatus 500 may include nozzles 510 and 520. The nozzle apparatus 500 may include nozzles 510 and 520. A first nozzle 510 may overlap the folding region FR, while second nozzles 520 may overlap the non-folding regions NFR1 and NFR2, respectively. The first nozzle 510 may be used to form a first bonding part 451a, and the second nozzles 520 may be used to form bonding parts 453a and 455a. The first bonding part 451a formed from the first nozzle 510 may include an optically clear resin having a larger elastic modulus than the bonding parts 453*a* and 455*a* formed from the second nozzles 520.

Subsequently, referring to an embodiment shown in FIGS. 11 and 12, a nozzle apparatus 501 may be placed above the display panel 100. The nozzle apparatus 501 may include nozzles 530. The nozzle apparatus 501 may be an inkjet apparatus having third nozzles 530. The third nozzles 530 may overlap the folding region FR and the non-folding regions NFR1 and NFR2, respectively. The bonding members 451*b*, 453*b* and 455*b* formed from the third nozzles 530 may all have the same or substantially the same elastic modulus. Subsequently, as shown in FIG. 12, a mask M_1 may be placed above the non-folding regions NFR1 and NFR2. The mask M_1 may overlap the non-folding regions NFR1 and NFR2 and may expose the folding region FR. The mask M_1 may be a slit mask including openings. It is, however, to be understood that the disclosure is not limited thereto. In an embodiment, the mask M_1 may overlap the folding region FR and the non-folding regions NFR1 and NFR2, and may be a halftone mask having more openings in the folding region FR than in the non-folding regions NFR1 and NFR2.

Figure 13:
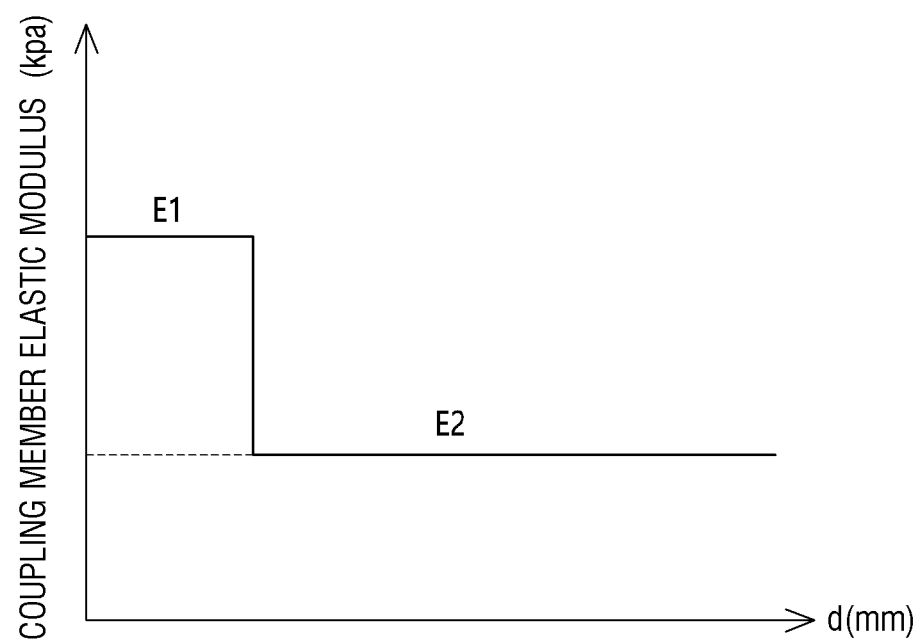
FIG. 13 is a graph showing the elastic modulus of the bonding member versus the distance from the first reference line.
Figure 14:
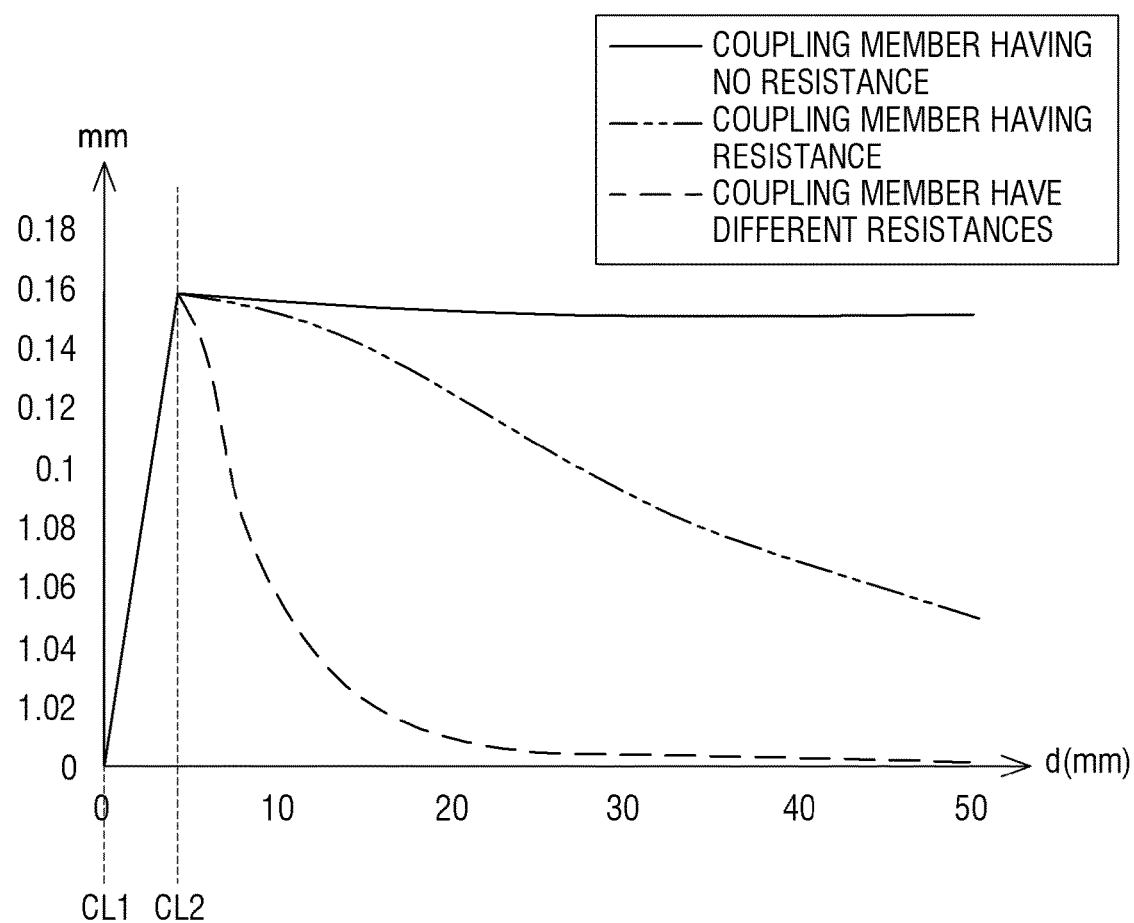
FIG. 14 is a graph showing the degree of decoupling depending on the resistance as the bonding member is folded.

FIG. 13 is a graph showing the elastic modulus of the bonding member versus the distance from the first reference line. FIG. 14 is a graph showing the degree of decoupling depending on the resistance as the bonding member is folded.

In the graph shown in FIG. 13, the horizontal axis may represent the distance d (in mm) from the first reference line $CL_1$, and the vertical axis may represent the bonding member elastic modulus E (in kpa).

As described above, the bonding members 410 and 450 may have different elastic moduli E1 and E2. As an example, the panel-support film bonding member 410 and the bonding member 450 may have the first elastic modulus E1 in the folding region FR, and may have the second elastic modulus E2 that may be smaller than the first elastic modulus E1 in the non-folding regions NFR1 and NFR2.

FIG. 14 shows the length difference between the elements 100, 200 and 310 (or the decoupling length x between the elements 100, 200 and 310 in mm) depending on the distance d from the first reference line $CL_1$ in mm in a case that the bonding members 410 and 450 have no resistance, in a case that the bonding members 410 and 450 have a resistance and in a case that the bonding members 410 and 450 may have different resistances for different parts.

Initially, for all of the cases, the length difference or the decoupling length x in mm between the elements 100, 200 and 310 depending on the distance d in mm from the reference line $CL_1$ may be increased with the constant slope up to approximately 0.16 mm. Subsequently, in a case that the bonding members 410 and 450 have no resistance, the length difference or the decoupling length x may remain approximately 0.16 mm. In a case that the bonding members 410 and 450 have a resistance, the length difference or the decoupling length x may decrease from approximately 0.16 mm according to Equation 1 above. In a case that the bonding members 410 and 450 may have different resistances, the length difference or the decoupling length x may have a value between approximately 0.16 mm and the length difference obtained according to Equation 1 above.

The bonding members 410 and 450 may have the first elastic modulus E1 that may be a high elastic modulus in the folding region FR, and may have a second elastic modulus E2 that may be a low elastic modulus in the non-folding regions NFR1 and NFR2. Accordingly, it may be possible to prevent buckling from occurring in the thickness direction or physical deformation such as a crack or cracking, which may occur as the relative movement amount between the elements 100 and 200 may be rapidly decreased depending on the distance L from the second reference line $CL_2$ so that the stress may be greatly increased because the length change may not be accepted as the relative movement may be decreased.

Hereinafter, other embodiments will be described. In the following description, the same or similar elements will be denoted by the same or similar reference numerals, and redundant descriptions will be omitted or briefly described.

Figure 15:
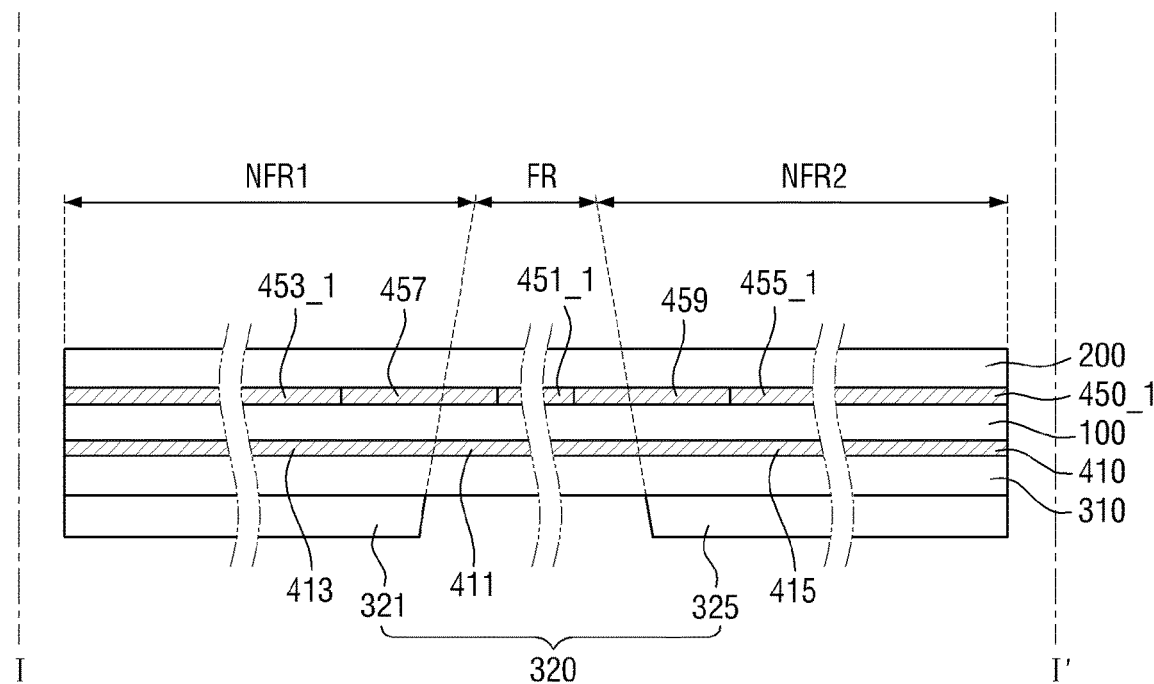
FIG. 15 is a schematic cross-sectional view of a display device according to an embodiment.
Figure 16:
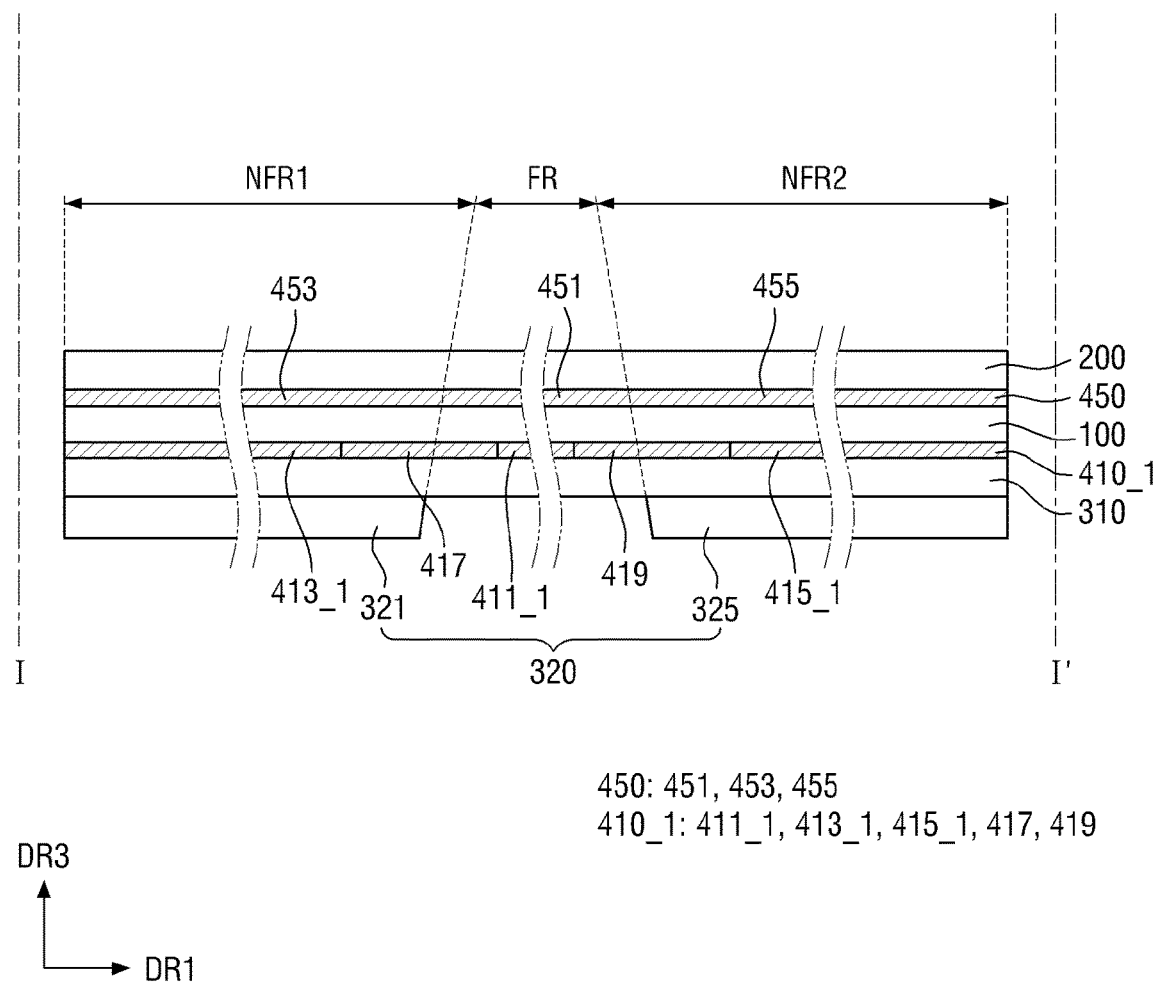
FIG. 16 is a schematic cross-sectional view of a display device according to an embodiment.
Figure 17:
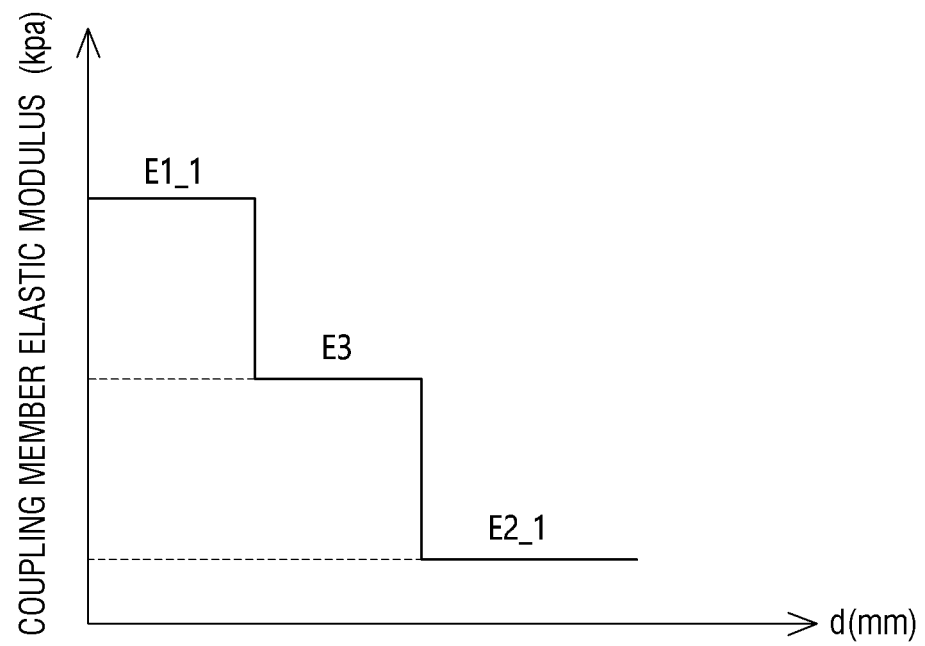
FIG. 17 is a graph showing the elastic modulus of the bonding member versus the distance from the first reference line of the embodiment of FIG. 16.

FIG. 15 is a schematic cross-sectional view of a display device according to an embodiment. FIG. 16 is a schematic cross-sectional view of a display device according to an embodiment. FIG. 17 is a graph showing the elastic modulus of the bonding member versus the distance from the first reference line of an embodiment of FIG. 16.

FIGS. 15 and 16 show modifications of bonding members 450_1 and 460_1, respectively.

An embodiment shown in FIG. 15 may be different from an embodiment of FIG. 3 in that a bonding member 450_1 may comprise a bonding part 457 disposed between a first bonding part 451_1 and a bonding part 453_1 and a bonding part 459 disposed between the first bonding part 451_1 and a bonding part 455_1.

As an example, the first bonding part 451_1 may be disposed in a part (center) of the folding region FR and may expose portions of the folding region FR adjacent to the non-folding regions NFR1 and NFR2. The bonding parts 453_1 and 455_1 may be disposed in a part of the non-folding regions NFR1 and NFR2 including the ends of the non-folding regions NFR1 and NFR2 and may expose portions of the non-folding regions NFR1 and NFR2 adjacent to the folding region FR.

The bonding member 450_1 may include the bonding part 457 disposed between the first bonding part 451_1 and the bonding part 453_1 and the bonding part 459 disposed between the first bonding part 451_1 and the bonding part 455_1. Each of the bonding parts 457 and 459 may have an elastic modulus between the elastic modulus of the first bonding part 451_1 and the elastic modulus of the bonding parts 453_1 and 455_1.

The bonding parts 457 and 459 may be disposed across a part of the folding region FR and a part of the non-folding regions NFR1 and NFR2. As an example, the inner side surfaces of the bonding parts 457 and 459 may overlap the folding region FR, and the outer side surfaces of the bonding parts 457 and 459 may overlap the non-folding regions NFR1 and NFR2.

FIG. 16 is a schematic cross-sectional view of a display device according to an embodiment.

An embodiment shown in FIG. 16 may be different from an embodiment of FIG. 3 in that a panel-support film bonding member 410_1 may include a panel-support film bonding part 417 disposed between a first panel-support film bonding part 411_1 and a panel-support film bonding part 413_1, and a panel-support film bonding part 419 disposed between the first panel-support film bonding part 411_1 and a panel-support film bonding part 415_1.

As an example, the first panel-support film bonding part 411_1 may be disposed in a part (center) of the folding region FR and may expose portions of the folding region FR adjacent to the non-folding regions NFR1 and NFR2. The panel-support film parts 413_1 and 415_1 may be disposed in a part of the non-folding regions NFR1 and NFR2 including the ends of the non-folding regions NFR1 and NFR2 and may expose portions of the non-folding regions NFR1 and NFR2 adjacent to the folding region FR.

The bonding member 410_1 may include the panel-support film bonding part 417 disposed between the first panel-support film bonding part 411_1 and the panel-support film bonding part 413_1, and the panel-support film bonding part 419 disposed between the first panel-support film bonding part 411_1 and the panel-support film bonding part 415_1. Each of the panel-support film bonding parts 417 and 419 may have an elastic modulus between the elastic modulus of the first panel-support film bonding part 411_1 and the elastic modulus of the panel-support film bonding parts 413_1 and 415_1.

The panel-support film bonding parts 417 and 419 may be disposed across a part of the folding region FR and a part of the non-folding regions NFR1 and NFR2. As an example, the inner side surfaces of the panel-support film bonding parts 417 and 419 may overlap the folding region FR, and the outer side surfaces of the panel-support film bonding parts 417 and 419 may overlap the non-folding regions NFR1 and NFR2.

In an embodiment, the panel-support film bonding member 410_1 and the bonding member 450_1 may be disposed together.

Referring to FIG. 17 in conjunction with FIG. 15, the first bonding part 451_1 may have a first elastic modulus E1_1, the bonding parts 453_1 and 455_1 may have a second elastic modulus E2_1, and the bonding parts 457 and 459 may have a third elastic modulus E3 between the first elastic modulus E1_1 and the second elastic modulus E2_1.

Referring to FIG. 17 in conjunction with FIG. 15, the first panel-support film bonding part 411_1 may have a first elastic modulus E1_1, the panel-support film bonding parts 413_1 and 415_1 may have a second elastic modulus E2_1, and the panel-support film bonding parts 417 and 419 may have a third elastic modulus E3 between the first elastic modulus E1_1 and the second elastic modulus E2_1.

Figure 18:
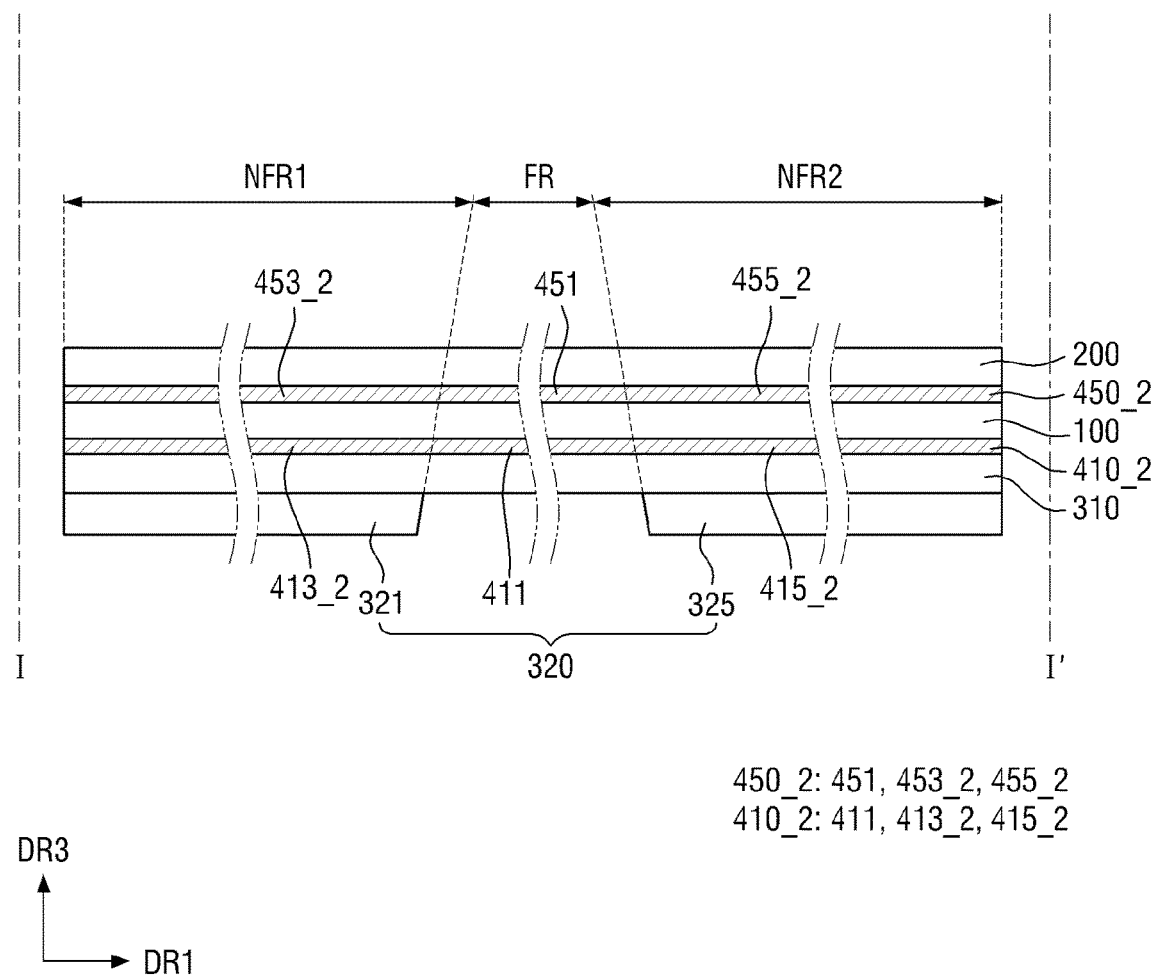
FIG. 18 is a schematic cross-sectional view of a display device according to an embodiment.

FIG. 18 is a schematic cross-sectional view of a display device according to an embodiment.

An embodiment of FIG. 18 may be different from an embodiment of FIG. 3 in that each of bonding parts 413_2, 415_2, 453_2 and 455_2 disposed in the non-folding regions NFR1 and NFR2 has an elastic modulus decreasing from the folding region FR to the ends of the non-folding regions NFR1 and NFR2.

As an example, the elastic modulus of each of bonding parts 413_2, 415_2, 453_2 and 455_2 disposed in the non-folding regions NFR1 and NFR2 decreases from the folding region FR to the ends of the non-folding regions NFR1 and NFR2.

In an embodiment, the elastic modulus of each of bonding parts 413_2, 415_2, 453_2 and 455_2 disposed in the non-folding regions NFR1 and NFR2 may decrease linearly from the folding region FR to the ends of the non-folding regions NFR1 and NFR2.

In an embodiment, the elastic modulus of each of bonding parts 413_2, 415_2, 453_2 and 455_2 disposed in the non-folding regions NFR1 and NFR2 may decrease stepwise from the folding region FR to the ends of the non-folding regions NFR1 and NFR2.

In an embodiment, the elastic modulus of each of bonding parts 413_2, 415_2, 453_2 and 455_2 disposed in the non-folding regions NFR1 and NFR2 may decrease non-linearly from the folding region FR to the ends of the non-folding regions NFR1 and NFR2.

In an embodiment, the elastic modulus of each of bonding parts 413_2, 415_2, 453_2 and 455_2 disposed in the non-folding regions NFR1 and NFR2 may decrease in inverse proportion to the square of the distance from the second reference line $CL_2$ of FIG. 6 from the folding region FR to the ends of the non-folding regions NFR1 and NFR2.

In an embodiment, one of the bonding member 450_2 and the panel-support film bonding member 410_2 may be employed.

Figure 19:
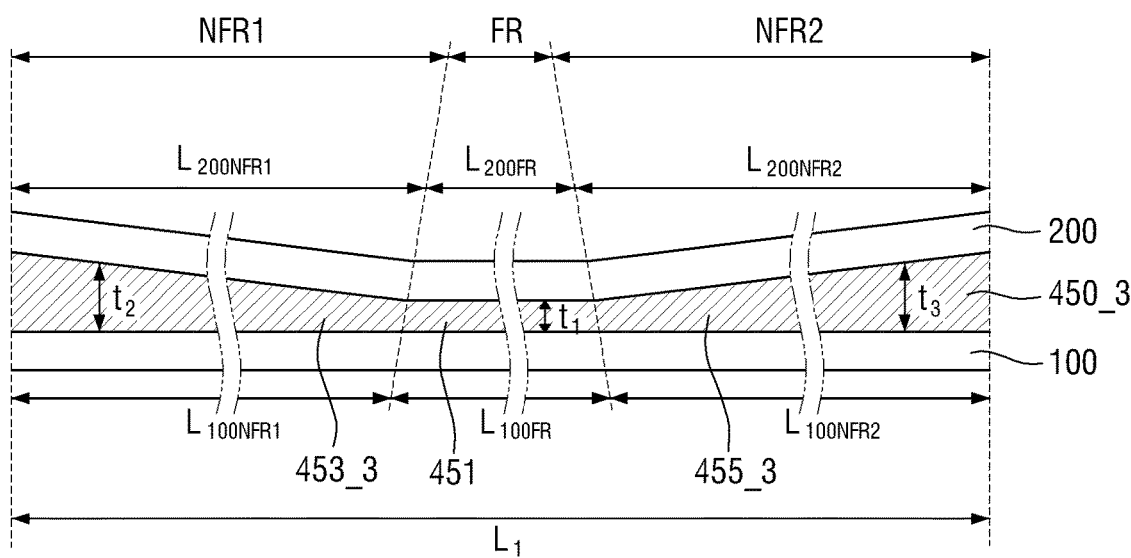
FIG. 19 is a schematic cross-sectional view of a display device according to an embodiment.

FIG. 19 is a schematic cross-sectional view of a display device according to an embodiment.

An embodiment of FIG. 19 may be different from an embodiment of FIG. 5 in that a thickness of a bonding member 450_3 in the folding region FR may be different from thicknesses thereof in the non-folding regions NFR1 and NFR2.

As an example, a first bonding part 451 may have a first thickness $t_1$, and bonding parts 453_3 and 455_3 may have thicknesses t2 and t3 having a larger average value than the first thickness $t_1$, respectively.

The thicknesses t2 and t3 of the bonding parts 453_3 and 455_3 may gradually increase from adjacent portions of the folding region FR (the boundary between the non-folding regions NFR1 and NFR2 and the folding region FR) to the ends of the non-folding regions NFR1 and NFR2.

For example, the thicknesses t2 and t3 of the bonding parts 453_3 and 455_3 may gradually increase from adjacent portions of the folding region FR (the boundary between the non-folding regions NFR1 and NFR2 and the folding region FR) to the ends of the non-folding regions NFR1 and NFR2 in proportion to the square of the distance from the second reference line $CL_2$.

Similarly to the above embodiment, the average thickness of the panel-support film bonding parts in the non-folding regions NFR1 and NFR2 may be larger than the thickness of the panel-support film bonding part in the folding region FR and may gradually increase from the adjacent portions of the folding region FR to the ends of the non-folding regions NFR1 and NFR2.

Figure 20:
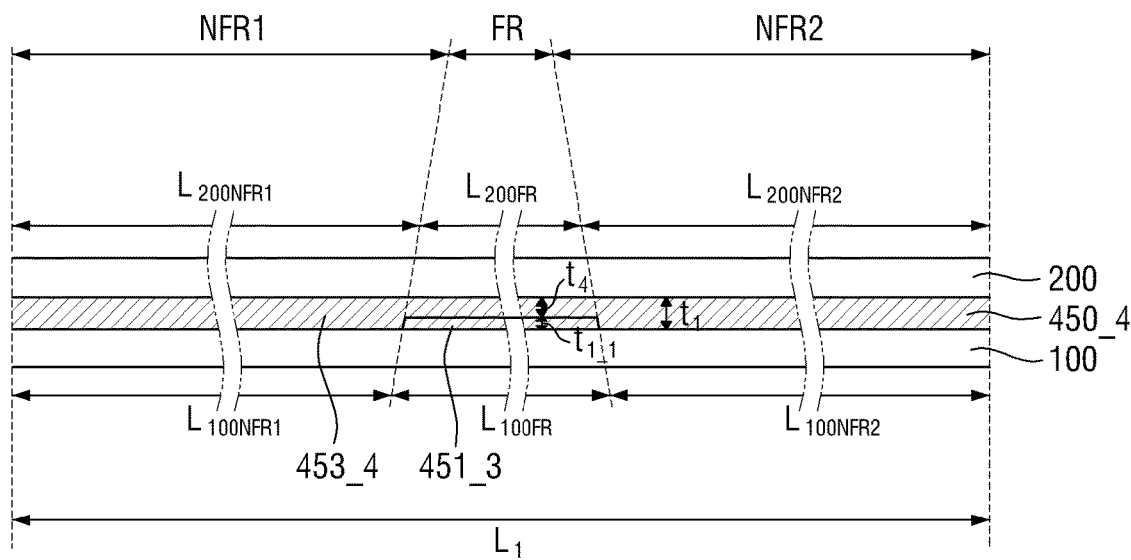
FIG. 20 is a schematic cross-sectional view of a display device according to an embodiment.
Figure 20:
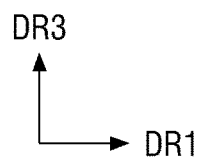

FIG. 20 is a schematic cross-sectional view of a display device according to an embodiment.

An embodiment of FIG. 20 may be different from an embodiment of FIG. 5 in that a first bonding part 451_3 of a bonding member 450_4 may have a (1-1) thickness $t_{1\_1}$, and a second bonding part 453_4 may be disposed across the non-folding regions NFR1 and NFR2 and the folding region FR.

As an example, the first bonding part 451_3 of the bonding member 450_4 may have the (1-1) thickness $t_{1\_1}$, and the second bonding part 453_4 may be disposed across the non-folding regions NFR1 and NFR2 and the folding region FR.

The second bonding part 453_4 may have a first thickness $t_1$ in the non-folding regions NFR1 and NFR2 and a fourth thickness t4 smaller than the first thickness $t_1$ in the folding region FR, and may be in contact with the first bonding part 451_3 in the folding region FR. The sum of the (1-1) thickness $t_{1\_1}$ and the fourth thickness t4 may be equal to the first thickness $t_1$.

It is to be understood that the bonding member may have the same configuration as the above embodiment.

Figure 21:
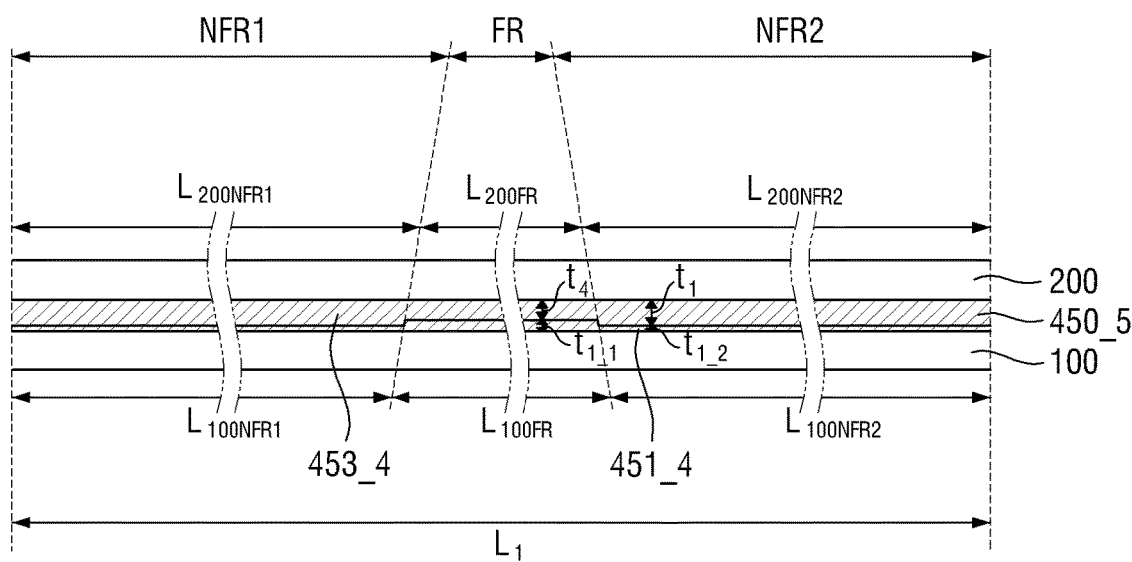
FIG. 21 is a schematic cross-sectional view of a display device according to an embodiment.

FIG. 21 is a schematic cross-sectional view of a display device according to an embodiment.

The embodiment of FIG. 21 may be different from an embodiment of FIG. 5 in that a first bonding part 451_4 of a bonding member 450_5 may be disposed across the folding region FR and the non-folding regions NFR1 and NFR2, and a second bonding part 453_4 of the bonding member 450_5 may be disposed across the folding region FR and the non-folding regions NFR1 and NFR2.

An embodiment of FIG. 21 may be different from an embodiment of FIG. 5 in that a first bonding part 451_4 of a bonding member 450_5 may be disposed across the folding region FR and the non-folding regions NFR1 and NFR2, and a second bonding part 453_4 of the bonding member 450_5 may be disposed across the folding region FR and the non-folding regions NFR1 and NFR2.

The first bonding part 451_4 may have the (1-1) thickness $t_{1\_1}$ in the folding region FR, and may have the (1-2) thickness $t_{1\_2}$ smaller than the (1-1) thickness in the non-folding regions NFR1 and NFR2.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display device comprising:
    a first region, a second region adjacent to a side of the first region, and a third region adjacent to another side of the first region, the first region corresponding to a folding region and each of the second and third regions corresponding to non-folding regions;
    a display panel disposed in the first region, the second region and the third region;
    a window disposed on and overlapping the display panel; and
    a bonding member disposed between the display panel and the window and disposed in the first region, the second region and the third region, wherein an elastic modulus of the bonding member in the first region is greater than an elastic modulus of the bonding member in any of the second region and the third region, the bonding member comprising:
    a first bonding part having a first elastic modulus and disposed in the first region;
    a second bonding part having a second elastic modulus and disposed in the second region; and
    a third bonding part having a third elastic modulus and disposed in the third region,
    wherein the first elastic modulus is greater than each of the second elastic modulus and the third elastic modulus.

2. The display device of claim 1, wherein the first elastic modulus has a value that is equal to or greater than ten times the second elastic modulus and the third elastic modulus.

3. The display device of claim 2, wherein the first elastic modulus ranges from about 50 kpa to about 500 kpa.

4. The display device of claim 1, wherein the first bonding part comprises:
    a first side surface aligned with a boundary between the first region and the second region; and
    a second side surface aligned with a boundary between the first region and the third region.

5. The display device of claim 4, wherein the second bonding part comprises:
    a first inner side surface on a side of the second bonding part, the first inner side surface contacting the first side surface of the first bonding part; and
    a first outer side surface on another side of the second bonding part,
    the third bonding part comprises:
    a second inner side surface on a side of the third bonding part, the second inner side surface contacting the second side surface of the first bonding part; and
    a second outer side surface on another side of the third bonding part, and
    the second elastic modulus of the second bonding part decreases from the first inner side surface to the first outer side surface.

6. The display device of claim 5, wherein the second elastic modulus of the second bonding part decreases stepwise from the first inner side surface to the first outer side surface.

7. The display device of claim 5, wherein the second elastic modulus of the second bonding part decreases linearly from the first inner side surface to the first outer side surface.

8. The display device of claim 5, wherein the second elastic modulus of the second bonding part decreases non-linearly from the first inner side surface to the first outer side surface.

9. The display device of claim 8, wherein the second elastic modulus of the second bonding part is inversely proportional to a square of a distance from the first inner side surface and decreases non-linearly from the first inner side surface to the first outer side surface.

10. The display device of claim 5, wherein
    the first bonding part has a first thickness, and the second bonding part has a second thickness,
    the second thickness of the second bonding part increases from the first inner side surface to the first outer side surface,
    the first thickness is uniform, and
    an average thickness of the second thickness is greater than the first thickness.

11. The display device of claim 10, wherein the second thickness of the second bonding part increases linearly from the first inner side surface to the first outer side surface.

12. The display device of claim 10, wherein the second thickness of the second bonding part increases non-linearly from the first inner side surface to the first outer side surface.

13. The display device of claim 10, wherein
    the third bonding part has a third thickness, the third thickness increasing from the second inner side surface to the second outer side surface, and
    an average thickness of the third thickness is greater than the first thickness of the first bonding part.

14. The display device of claim 5, wherein
    the third bonding part comprises:
    a second inner side surface on a side of the third bonding part, the second inner side surface contacting the second side surface of the first bonding part; and
    a second outer side surface on another side of the third bonding part, and
    the third elastic modulus of the third bonding part decreases from the second inner side surface to the second outer side surface.

15. The display device of claim 1, further comprising:
    a fourth bonding part disposed between the first bonding part and the second bonding part; and
    a fifth bonding part disposed between the first bonding part and the third bonding part, wherein
    the fourth bonding part has a fourth elastic modulus between the first elastic modulus and the second elastic modulus, and the fifth bonding part has a fifth elastic modulus between the first elastic modulus and the third elastic modulus.

16. The display device of claim 1, further comprising:
a support film disposed apart from the window with the display panel disposed between the support film and the window; and
a panel-support film bonding member disposed between the support film and the display panel, the panel-support film bonding member comprising:
a first panel-support film bonding part disposed in the first region;
a second panel-support film bonding part disposed in the second region; and
a third panel-support film bonding part disposed in the third region,
wherein an elastic modulus of the first panel-support film bonding part is greater than an elastic modulus of the second panel-support film bonding part and an elastic modulus of the third panel-support film bonding part.

17. A display device comprising:
a folding region, a first non-folding region adjacent to a side of the folding region, and a second non-folding region adjacent to another side of the folding region;
a display panel disposed in the folding region, the first non-folding region and the second non-folding region;
a window disposed on and overlapping the display panel; and
a bonding member disposed between the display panel and the window and disposed in the folding region, the first non-folding region and the second non-folding region, wherein an elastic modulus of the bonding member in the folding region is greater than an elastic modulus of the bonding member in any of the first non-folding region and the second non-folding region, the window comprising:
a first surface facing the display panel; and
a second surface opposite to the first surface, wherein the second surface of the window disposed in the first non-folding region faces the second surface of window disposed in the second non-folding region in a folded state,
the bonding member comprises:
a first bonding part having a first elastic modulus and disposed in the folding region;
a second bonding part having a second elastic modulus and disposed in the first non-folding region; and
a third bonding part having a third elastic modulus and disposed in the second non-folding region, and
the first elastic modulus is greater than each of the second elastic modulus and the third elastic modulus.

18. The display device of claim 17, wherein the first elastic modulus has a value that is equal to or greater than ten times the second elastic modulus and the third elastic modulus.

19. The display device of claim 18, wherein the first elastic modulus ranges from about 50 kpa to about 500 kpa.

20. The display device of claim 17, further comprising:
a support film disposed apart from the window with the display panel disposed between the support film and the window; and
a panel-support film bonding member disposed between the support film and the display panel, the panel-support film bonding member comprising:
a first panel-support film bonding part disposed in the folding region;
a second panel-support film bonding part disposed in the first non-folding region; and
a third panel-support film bonding part disposed in the second non-folding region,
wherein an elastic modulus of the first panel-support film bonding part is greater than an elastic modulus of the second panel-support film bonding part and an elastic modulus of the third panel-support film bonding part.

21. The display device of claim 1, wherein the bonding member being light-transmitting and being selected from an optically clear adhesive (OCA) and an optically clear resin (OCR).

22. The display device of claim 1, wherein the display device is a top emitting display device where light exits from the display panel through the window to the outside.

* * * * *